United States Patent
Van Den Bergen

(10) Patent No.: US 10,631,441 B2
(45) Date of Patent: Apr. 21, 2020

(54) CABINET FOR ELECTRONIC EQUIPMENT

(71) Applicant: ASML Netherlands B.V., AH Veldhoven (NL)

(72) Inventor: David Johannes Van Den Bergen, Leidschendam (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 14/781,594

(22) PCT Filed: Apr. 8, 2014

(86) PCT No.: PCT/EP2014/057099
§ 371 (c)(1),
(2) Date: Oct. 1, 2015

(87) PCT Pub. No.: WO2014/166970
PCT Pub. Date: Oct. 16, 2014

(65) Prior Publication Data
US 2016/0066478 A1 Mar. 3, 2016

(30) Foreign Application Priority Data

Apr. 8, 2013 (NL) ....................................... 2010589
Apr. 11, 2013 (NL) ....................................... 2010624

(51) Int. Cl.
*H05K 7/20* (2006.01)
*G03F 7/20* (2006.01)
*H01J 37/317* (2006.01)

(52) U.S. Cl.
CPC ......... *H05K 7/20754* (2013.01); *G03F 7/708* (2013.01); *G03F 7/70991* (2013.01);
(Continued)

(58) Field of Classification Search
CPC .... H04Q 1/035; H04Q 1/025; H05K 7/20572; H05K 7/20745; H05K 7/20754; H05K 7/20736; G06F 1/20
See application file for complete search history.

(56) References Cited

U.S. PATENT DOCUMENTS 4,679,123 A   7/1987 Young
5,216,579 A   6/1993 Basara et al.
(Continued)

FOREIGN PATENT DOCUMENTS

DE   10210417 A1   10/2003
JP   07-29892      6/1995
(Continued)

OTHER PUBLICATIONS

Office Action issued from the Japanese Intellectual Property Office of Patent Application No. 2018-089288, dated Jul. 8, 2019 (9 pages).
(Continued)

*Primary Examiner* — James Wu
*Assistant Examiner* — Hung Dang
(74) *Attorney, Agent, or Firm* — Finnegan, Henderson, Farabow, Garrett & Dunner, LLP

(57) ABSTRACT

Cabinet (10) for accommodating electronic equipment (46). The cabinet comprises a casing (12) with an access opening (24) at a access side (23), and a second side (17) opposite to the access side, an electronic equipment rack (40a), a first plenum space (35) between the access side and the rack, and a channel (36) in fluid communication with the second side and the first plenum space. The cabinet encloses a first cooling medium (27) that is in thermal communication with the electronic equipment. A cooling arrangement (29) is provided at the second side, which comprises a flow generator (30) for generating a flow (Φf) of the first cooling
(Continued)

medium from the first plenum space across the electronic equipment toward the second side, and a heat exchanger (31) for extracting heat from the first cooling medium. The first cooling medium is subsequently recirculated through the channel to the first plenum space.

40 Claims, 12 Drawing Sheets

(52) U.S. Cl.
CPC ...... *H01J 37/3174* (2013.01); *H05K 7/20145* (2013.01); *H05K 7/20763* (2013.01); *H01J 2237/31793* (2013.01)

(56) References Cited

U.S. PATENT DOCUMENTS

| | | | |
|---|---|---|---|
| 6,407,933 | B1 | 6/2002 | Bolognia et al. |
| 7,397,661 | B2* | 7/2008 | Campbell .......... H05K 7/20754 |
| | | | 165/104.33 |
| 7,492,593 | B2* | 2/2009 | Campbell .......... H05K 7/20754 |
| | | | 165/104.33 |
| 7,688,578 | B2* | 3/2010 | Mann ................. H05K 7/20745 |
| | | | 361/679.46 |
| 7,724,513 | B2* | 5/2010 | Coglitore ............ H05K 7/1497 |
| | | | 165/104.33 |
| 8,259,449 | B2* | 9/2012 | Novotny ............ H05K 7/20709 |
| | | | 361/696 |
| 2004/0211924 | A1 | 10/2004 | Tanaka et al. |
| 2005/0057912 | A1 | 3/2005 | Hardt et al. |
| 2006/0269216 | A1* | 11/2006 | Wiemeyer ................ H04Q 1/13 |
| | | | 385/147 |
| 2007/0236881 | A1 | 10/2007 | Harder et al. |
| 2008/0049396 | A1 | 2/2008 | Campbell et al. |
| 2008/0257639 | A1 | 10/2008 | Yamaguchi et al. |
| 2008/0266789 | A1 | 10/2008 | Hruby et al. |
| 2009/0086432 | A1 | 4/2009 | Campbell et al. |
| 2010/0229584 | A1 | 9/2010 | Gilder |
| 2012/0155027 | A1* | 6/2012 | Broome ............... H05K 7/1497 |
| | | | 361/696 |
| 2012/0170208 | A1 | 7/2012 | Chen et al. |
| 2012/0276834 | A1* | 11/2012 | Peng .................. H05K 7/20745 |
| | | | 454/184 |
| 2014/0078668 | A1* | 3/2014 | Goulden ........... H05K 7/20736 |
| | | | 361/679.47 |

FOREIGN PATENT DOCUMENTS

| | | |
|---|---|---|
| JP | 10-311638 | 11/1998 |
| JP | 2001510316 A | 7/2001 |
| JP | 2002-124790 | 4/2002 |
| JP | 2009-266914 | 11/2009 |
| JP | 2012-235068 | 11/2012 |
| WO | WO9903179 A1 | 1/1999 |
| WO | WO 01 15507 A1 | 3/2001 |
| WO | WO 03 083631 A1 | 10/2003 |
| WO | WO 2010 094719 A1 | 8/2010 |
| WO | WO 2010 094804 A1 | 8/2010 |
| WO | WO 2012 080278 A1 | 6/2012 |
| WO | WO 2012 146788 A1 | 11/2012 |

OTHER PUBLICATIONS

"Rittal LCP nu ook voor de industrie", Press release, Rittal B.V., Zevenaar, Netherlands, Jun. 19, 2012.
"Rital the system", IT Cooling leaflet, LCP included in between racks, Rittal catalogue 34/IT infrastructure 2012.

* cited by examiner

CABINET FOR ELECTRONIC EQUIPMENT

TECHNICAL FIELD

The invention relates to a cabinet for accommodating electronic equipment, to an electronic equipment cabinet for cooling the same, to a lithography unit provided with such a cabinet, and to a lithography system.

BACKGROUND ART

Electronic equipment can generate a significant amount of heat during operation. If the heat generation rate exceeds the system's heat dissipation capabilities, then the excess heat can quickly lead to component failure and/or system shutdown. Cooling of the equipment is then required to prevent the equipment from burning out. Due to limited space in facilities, electronic equipment is typically stacked within racks that are arranged side-by-side in rows. Such racks are typically enclosed by cabinets that protect the equipment against dust, humidity, and other environmental effects. Unfortunately, the isolating effect of the cabinet also lowers the allowable heat generation rates for the enclosed electronic equipment. Therefore, in a known electronic cabinet configuration, a closed-loop cooling system is provided inside the cabinet, for cooling the electronic components during operation. In this cooling system, a cooling medium like air is internally circulated in a closed-loop airflow that circulates in a substantially horizontal plane. This known system includes a side-mounted fan and heat exchanger arrangement, for circulating and chilling the air. The fan is rotatable to generate the circulating airflow along and/or across the electronic components. A portion of the thermal energy generated by the equipment is transferred to the passing airflow. The airflow absorbs some of the heat and transports this heat away from the equipment, resulting in the equipment being cooled. The heat exchanger allows part of the thermal energy to be extracted from the airflow, thereby extracting the excess energy from the cabinet, and avoiding heat accumulation and resulting temperature increase on the inside of the cabinet. A second cooling fluid (e.g. a liquid with high heat capacity) is circulated in a fluid circuit provided inside the heat exchanger, this second fluid being in thermal communication with the flowing air. Thermal energy transfer between the air and the second cooling fluid causes a cooling of the heated air. The resulting heated second cooling fluid can subsequently be discharged from the heat exchanger, and cooled at a location external to the cabinet, while the cooled airflow is re-circulated back to the electronic equipment. Unfortunately, a side-by-side row arrangement of these cabinets has a relatively large perimeter.

SUMMARY OF INVENTION

It may be desirable to provide a cooling cabinet for which the internal layout of electronic components and cooling means is optimized for a side-by-side cabinet arrangement with a minimal footprint.

Therefore, according to a first aspect, there is provided a cabinet for accommodating electronic equipment, wherein the cabinet comprises: —a casing comprising an access side provided with an opening for accessing an interior of the casing, and a second side opposite to the access side; —a rack for accommodating the electronic equipment inside the casing, and positioned within the casing to define a first plenum space between the access side and the rack; —wherein the cabinet is configured for enclosing a first cooling medium in thermal communication with the electronic equipment; —a flow generator, for generating a flow of the first cooling medium from the first plenum space across the electronic equipment toward the second side; —a heat exchanger for extracting thermal energy from the first cooling medium; wherein the heat exchanger and the flow generator are provided at or near the second side of the casing, and wherein the casing comprises a channel provided along a lateral wall of the rack, and in fluid communication with the second side and the first plenum space, for re-circulating the first cooling medium from the second side to the first plenum space.

It may be helpful to an understanding of the invention to set forth definitions of certain terms to be used herein. The term "electronic equipment" refers to any equipment (e.g. computer system, electro-optical system, photonic system, etc) containing one or more heat generating components.

The term "(electronics) rack" refers herein to any frame, chassis, or collection of shelves mounted on vertical supports for mounting several electronic equipment units. The height of electronic equipment has become standardized to assume an integer number of so-called "rack units". A rack unit is abbreviated by "U", and has a value of 44.45 mm (1.75 inch). The rack(s) inside the casing may be chosen to be compliant with the international 19-inch rack standard IEC 60297-3-100. A 19-inch rack is a standardized frame or enclosure for mounting electronic equipment units, each having a front panel with a total width of 19 inches (482.6 mm). According to embodiments, the rack(s) inside the casing may extend substantially along the entire height of the inside of the casing.

The "casing" or enclosure surrounding the rack may be of varying size and shape. The "access opening" (or "front opening") allows easy access to the electronic equipment accommodated on the interior of the cabinet. The casing may include one or more doors for closing off the access opening. Preferably, there is only one single access opening that is accessible in an operational position of the cabinet.

The term "heat exchanger" or "heat transfer device" refers herein to a heat exchanger means which is configured to be traversed by at least one cooling medium (e.g. a fluid) is such a manner that this cooling medium will be able to transfer thermal energy to a surface of the heat exchanger without chemically reacting or being absorbed. A heat exchanger may also be configured for operating based on at least two cooling media (e.g. a gas and a fluid) is such a manner that these cooling media remain physically separated (i.e. do not mix) while allowing the transfer of thermal energy between them. The heat exchanger may include one or several heat exchanger units coupled either in series or in parallel. Each heat exchanger may comprise first flow paths for the first cooling medium, and second flow paths for the second cooling medium (bounded by walls that are impermeable for the first cooling medium). Configuration and construction of the heat exchangers described herein can vary without departing from the scope of the present invention. The heat exchanger and the flow generator together are referred to herein as the "cooling arrangement".

The term "longitudinal channel" or "channel" refers herein to a corridor or fluid passage inside the casing, which provides a fluid connection between the first plenum space and the cooling arrangement at the second side of the casing. The first cooling medium is allowed to flow through this channel in a longitudinal direction between the second side (back side) and the access side (front side) of the casing, without traversing and substantially exchanging thermal energy with the electronic equipment. The proposed longitudinal cooling arrangement—which is characterized by the rear-mounted flow generator and heat exchanger assembly for inducing a closed-loop horizontally circulating flow of the first cooling medium through the channel, into the first plenum space, and then across the electronic equipment back toward the flow generator and heat exchanger—allows a width of the casing to be minimal. In addition, for a plurality of such cabinets that are arranged side-to-side to form a cabinet row, the heat exchanger discharge mechanisms for adjacent cabinets may be easily interconnected along their second sides (e.g. to a manifold for a second cooling medium) without requiring a substantial number of conduits and connectors. For cabinets that need not be accessible from the rear, two such cabinet rows may be efficiently arranged back-to-back into cabinet blocks with a minimal perimeter, without increasing maintenance requirements. Another advantage of the longitudinal cooling arrangement is that the cabinet height need not be extended to incorporate the cooling arrangement, which is advantageous in the case that the space between the cabinet and a superjacent structure is limited (either physically limited by a ceiling, or by a regulatory minimal distance from lighting, sprinkler systems, etc). The cabinet according to this aspect of the invention thus enables a tightly packed laterally abutting arrangement which reduces the perimeter or footprint needed for a given number of cabinets.

According to an embodiment, the rack comprises opposing lateral rack walls, wherein at least one lateral rack wall comprises a substantially closed panel that defines a vertical boundary of the channel.

The closed panel defines a boundary wall of the channel without needing further construction elements, and keeps the heated air flowing across the electronic equipment inside the rack separated from the cooled air flowing back through the channel. The opposing side walls may be formed by solid panel sheets comprising a metal, preferably one of stainless steel, galvanized steel, and powder coated steel.

According to a further embodiment, the lateral rack wall comprises an outer wall portion facing towards the channel and an inner wall portion facing away from the channel and comprising a recessed profile. The recessed profile may comprise a header wall portion and a recessed wall portion that is parallel and flush with respect to the header wall portion and arranged for accommodating a shelf mount for fixing a shelf to the inner wall portion.

The resulting rack wall configuration defines a cooling fluid channel boundary on one wall side and efficiently accommodates equipment (with standardized dimensions) on an opposing wall side, while minimizing the required lateral space taken up by the cabinet as a whole.

Preferably, the heat exchanger and the flow generator extend substantially over the entire second side of the casing. This configuration allows construction of a separate cooling and flow generation module that is fittingly mountable inside or onto the second side of the casing e.g. by using a cooler frame that covers an opening on the second side and spans the rear wall of the cabinet. Such a modular construction reduces maintenance requirements. A heat exchanger and flow generator that fully extend over the second side maximizes the achievable cooling and flow rates, and allows generating a relatively uniform cooled air flow distribution.

In some embodiments, the channel defines a vertical gap with a channel height, wherein the vertical gap extends from the second side of the cabinet to the plenum space at the access side. Such a vertical-and-longitudinal channel allows the closed-loop horizontally circulating flow of the first cooling medium to vary only marginally i.e. to remain relatively uniform along the vertical direction.

In a further embodiment, the cabinet has an internal height defined along a vertical direction between inner surfaces of the top wall and the floor, and wherein the channel height is equal to the internal height of the casing. In a further embodiment, the first plenum space has a plenum height that equals the internal height of the cabinet. Preferably, the internal casing height, the plenum height, and the channel height are all equal.

According to an embodiment, the cabinet comprises a further rack that is arranged inside the cabinet and is laterally separated from the rack, thereby defining the channel between the rack and the further rack along a longitudinal centerline of the cabinet. Preferably, adjacent side walls of the rack and further rack comprise closed panels that define vertical and longitudinal boundaries of the channel.

According to an embodiment, the cabinet comprises a flow guiding beam arranged in the first plenum space along a frontal aperture of the channel, for guiding the re-circulating flow of the first cooling medium into the first plenum space.

The flow guiding beam may also accommodate power and/or signal cabling for the electronic equipment. By combining the functions of guiding the airflow and leading cables to the respective connection sockets on the equipment, the available space within the casing is optimally utilized. This flow guiding beam directs the required cables to the corresponding equipment positions, where the cables exit the beam and are connected to a front side of the electronic equipment. By arranging the cables and connections for the equipment at the front of the cabinet, the need for accessing the equipment from the second side of the cabinet (e.g. during maintenance) is avoided or at least reduced. The guiding beam efficiently integrates the two functions of guiding cables to the respective electronic equipment, and of reducing turbulence in the air flow that enters the first plenum space.

According to an embodiment, the first cooling medium is a gas, wherein the heat exchanger is a gas-to-fluid heat exchanger configured for transferring the thermal energy to a second cooling medium comprising a fluid. Preferably, the gas is air, and the second cooling medium is water.

According to an embodiment, the gas-to-fluid heat exchanger is coupled to a fluidic circuit for conveying the second cooling medium out of the cabinet.

For a plurality of cabinets, each with a heat exchanger provided at a back side, a tightly packed side-by-side arrangement allows an efficient connection of the heat exchangers to a cooling fluid circuit manifold. Preferably, the fluidic circuit circulates one of a refrigerant and water.

According to an embodiment, the gas-to-fluid heat exchanger is a tube-type heat exchanger, positioned inside the cabinet near the second side to define a second plenum space between the heat exchanger and a rear wall of the cabinet, and wherein the flow generator comprises at least one fan that is provided within the second plenum space.

Alternatively or in addition, the heat exchanger may comprise a thermoelectric device, for example a Peltier element.

According to an embodiment, the first plenum space comprises a vertical recess at a side wall of the casing, for accommodating cabling for the electronic equipment along a vertical direction.

The lateral vertical recess directs the required power and/or signal cables to the corresponding equipment without obstructing the fluid flow within the casing, and in particular without inducing turbulences in the air flow in the first plenum space. At the respective equipment locations, the cables exit the vertical recess to be connected to a front side of a corresponding electronic equipment unit. By arranging the cables and connections for the equipment at the front of the cabinet, the need for accessing the equipment from the second side of the cabinet (e.g. during maintenance) is avoided or at least reduced.

According to an embodiment, the vertical recess defines a rectangular cuboid void that forms a lateral part of the first plenum space near the side wall.

According to an embodiment, the vertical recess extends vertically along substantially the entire side wall, and has a height substantially equal to a plenum height of the frontal plenum space.

In a further embodiment, the cabinet comprises at least one cable conduit that branches off from the vertical recess, wherein the at least one cable conduit is formed by a conduit that is mounted on the side wall on an outside of the casing.

This configuration allows desired functional groups or portions of the cables to be guided toward predetermined locations outside of the casing, which are displaced with respect to the floor aperture. The at least one vertical recess with cable conduits branching off from the vertical recess yields an efficient frontal cable attachment and lateral cable distribution arrangement for a cabinet that is stackable on top of and/or below (an)other structure(s). With the described cable attachment and distribution arrangement, the cables may be kept electromagnetically shielded as well as spatially separated from the contents of the casing. This attachment and distribution arrangement generally reduces or may even eliminate the need for accessing the equipment from the second side or rear side of the cabinet, for example during maintenance.

According to a further embodiment, the at least one cable conduit is curvedly shaped, preferably with a smooth curvature.

A smooth trajectory allows a cable to be inserted at one conduit end, to be gently conveyed through the cable conduit, and to exit at the other conduit end without being obstructed.

According to further embodiments, the at least one cable conduit is directed downwards in the vertical direction.

According to further embodiments, the at least one cable conduit is formed by bent upper and lower walls included in between an inner wall pane and an outer wall pane of the side wall.

According to yet a further embodiment, the bent upper and lower walls of the at least one cable conduit terminate in a vertical direction.

According to an embodiment, a side wall of the vertical recess is provided with at least one cable mount. Preferably, the at least one cable mount is provided in or near a height range for a predetermined electronic equipment unit, for allowing cabling to be branched off the vertical recess in a lateral direction at the height range in which the electronic equipment unit is accommodated in the cabinet.

According to a further embodiment, the cabinet comprises a floor aperture, for guiding cabling accommodated in the vertical recess to a lower outside of the cabinet. Preferably, the floor aperture is provided at a lateral end of the first plenum space.

According to an embodiment, the cabinet comprises at least one of rails and linear bearings arranged in a longitudinal direction along the floor of the cabinet.

By providing rails and/or bearings on the floor of the cabinet, the cabinet may be easily positioned onto and removed from a lower unit (e.g. a vacuum unit of a lithography system), to facilitate installation and maintenance.

In addition, the heat exchanger and flow generator may be combined into a cooler frame that also comprises linear bearings arranged in a longitudinal direction along a lower frame side. This cooler frame may thus be separately positioned onto and removed from the lower unit, to facilitate installation and maintenance of the cabinet without having to remove the cooler frame from the lower unit.

According to an embodiment, the cabinet comprises a temperature sensor, configured for measuring a temperature within the casing, and for generating a temperature measurement signal representative of the temperature.

Alternatively or in addition, the cabinet may comprise a flow sensor, configured for locally measuring the fluid flow within the casing, and for generating a flow measurement signal representative of the fluid flow.

The cabinet may further be provided with a control unit for controlling a flow generator yield (e.g. a fan rotation speed). Based on either the temperature measurement signal generated by the temperature sensor, or the flow measurement signal generated by the flow sensor, or both, a flow generator yield (e.g. rotation speed of the fans) may be adjusted in order to control the circulation of the first cooling medium (e.g. air) within the casing. Measurement of a temperature increase and/or a flow decrease may cause the control unit to initiate a compensating adjustment of the flow generator yield within the casing. If the temperature or fluid flow inside the casing rises above a predetermined critical temperature threshold or below a predetermined critical fluid flow threshold respectively, then the control unit may generate a critical indicator signal that may alert an operator. The critical indicator signal may for example be a sound alarm, a visual indication on a front-panel of the casing, or may induce an automatic shut-down procedure for the lithographic unit.

According to a second aspect, and in accordance with the advantages and effects described herein above, there is provided a lithography unit comprising: —a vacuum chamber, and —a cabinet for accommodating electronic equipment, according to embodiments of the first aspect. Preferably, the cabinet is positioned on the top side of the vacuum chamber. The cabinet may for example be fixed or moveably positioned on top of the vacuum chamber.

According to an embodiment wherein the cabinet is positioned on the top side of the vacuum chamber, the vacuum chamber is provided at a top side with linear bearing members or tracks along a longitudinal direction.

According to a third aspect, there is provided a lithography system, comprising at least two lithography units according to the second aspect of the invention, wherein the lithography units are arranged back-to-back, with the second sides of respective cabinets of back-to-back-arranged lithography units facing each other.

According a fourth aspect, there is provided a method for cooling electronic equipment, comprising: —providing the electronic components in a rack accommodated inside a cabinet that encloses a gaseous first cooling medium that is in thermal communication with the electric equipment; —circulating the first cooling medium from a access side of the cabinet across the electric equipment, thereby transferring thermal energy from the electric equipment to the first cooling medium; —cooling the first cooling medium with a heat exchanger provided at a second side of the cabinet, thereby transferring the thermal energy from the first cooling medium out of the heat exchanger and the cabinet; —recirculating the cooled first cooling medium via a channel inside the cabinet from the second side to a first plenum space provided between the rack and the access side, thereby providing cooled first cooling medium at the access side.

According to an embodiment, the heat exchanger comprises a second cooling medium, wherein the action of cooling the first cooling medium with the heat exchanger comprises: —transferring the thermal energy from the first cooling medium to the second cooling medium, and —conveying the second cooling medium out of the heat exchanger and the cabinet.

According to an aspect that may be subject of another application, there is provided a cabinet for accommodating electronic equipment, wherein the cabinet comprises: —a casing comprising a access side provided with an opening for accessing the interior of the casing, and a second side opposite to the access side; —a rack for accommodating the electronic equipment inside the casing, and positioned within the casing to define a first plenum space between the access side and the rack; wherein the first plenum space comprises a vertical recess at a side wall of the casing, for accommodating cabling for the electronic equipment along a vertical direction.

Embodiments of this aspect are further defined by the set of clauses presented herein below.

BRIEF DESCRIPTION OF DRAWINGS

Embodiments will now be described, by way of example only, with reference to the accompanying schematic drawings in which corresponding reference symbols indicate corresponding parts, and in which.

The figures are meant for illustrative purposes only, and do not serve as restriction of the scope or the protection as laid down by the claims.

DESCRIPTION OF EMBODIMENTS

Figure 1:
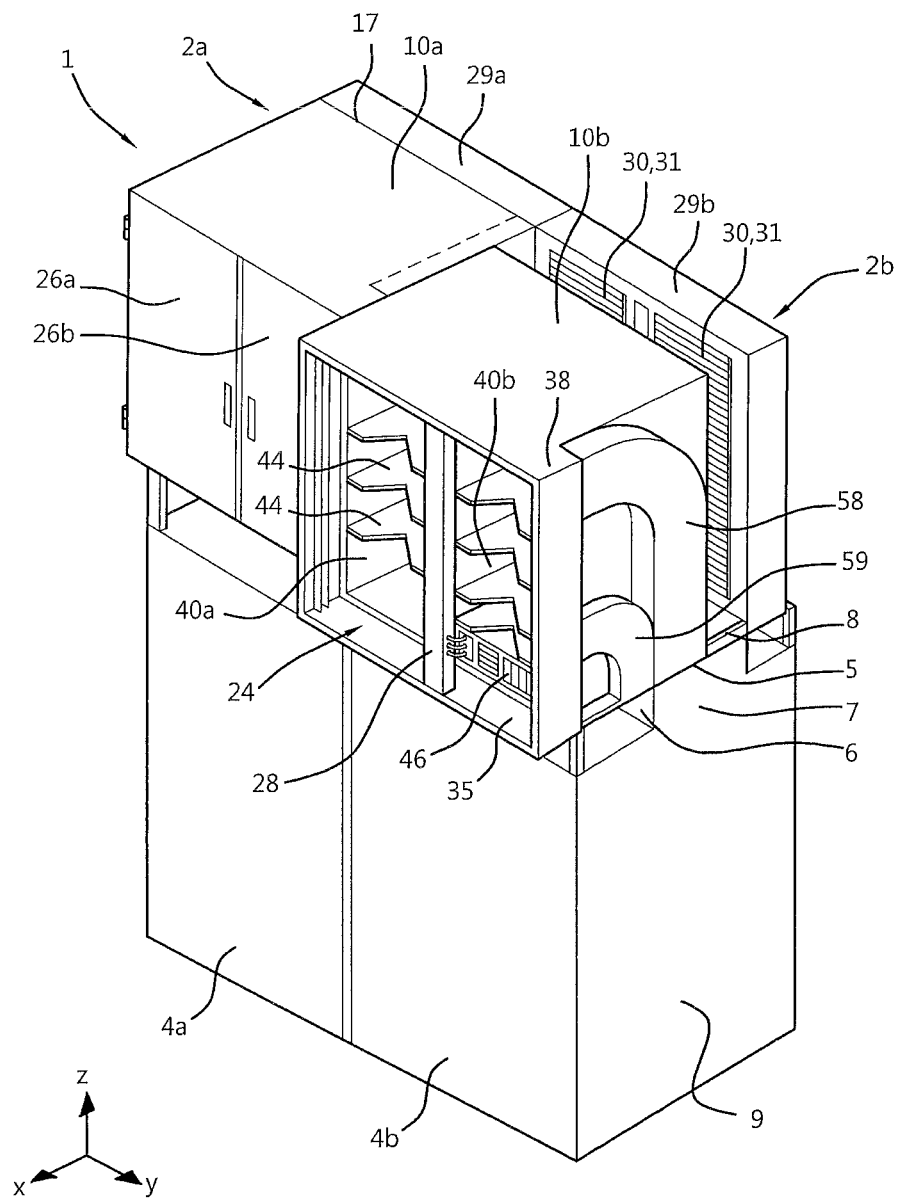
FIG. 1 schematically shows a perspective view of a lithography system according to an embodiment.

FIG. 1 schematically shows a perspective view of a tandem arrangement of two lithography units 2a, 2b (generally indicated by the reference number 2), which are arranged side-to-side in an abutting manner.

In the figures, various directions are indicated for defining positions, orientations and motion of the described objects. In the exemplary embodiments shown in the figures and described herein, X is used to indicate a longitudinal direction. Prepositions "front" and "rear" pertain to this longitudinal direction X. Further, Y is used to indicate a transversal direction that is perpendicular to X. During use of the exemplary lithography units 2 and cabinets 10, the longitudinal direction X and transversal direction Y span a plane that preferably is substantially parallel to the horizontal. Z is used to indicate a vertical direction that is perpendicular to X and Y. Prepositions "above" and "below" pertain to the vertical direction Z. It is understood that the concepts of the invention discussed herein are not limited to these directional definitions and preferred orientations.

Each lithography unit 2 comprises a vacuum chamber 4a, 4b (generally indicated by the reference number 4) at a lower side, and a cabinet 10a, 10b (generally indicated by the reference number 10) positioned above each vacuum chamber 4. Linear bearing members or rails 8 are provided on top of each vacuum chamber 4, which form guiding mechanisms for facilitating the positioning of the corresponding cabinet 10 on top of the vacuum chamber 4, or removing the cabinet 10 to a service position (as depicted in FIG. 1 by the forwardly displaced cabinet 10b). Each cabinet 10 comprises a closable casing or enclosure 12, which defines an interior and accommodates a pair of laterally spaced racks or frames 40a, 40b (generally indicated by the reference number 40). Each rack 40 carries a plurality of shelves 44a-44d (generally indicated by the reference number 44) for housing electronic equipment 46. Electronic equipment 46 may thus be accommodated within the cabinet 10. Each cabinet 10 is provided with an air-fluid cooling mechanism comprising an air circulator 30 and a heat exchanger arrangement 31, in a region at a second side or rear side of the cabinet 10. The heat exchanger 31 and the flow generator 30 extend over the entire rear side or second side 17, and are mounted in a separate cooler frame 29a, 29b (generally indicated by 29) positioned at the rear side 17. The casing 12 and the cooler frame 29 are separately mountable on and repositionable along the rails 8. The resulting modular construction improves the accessibility of the individual components and reduces service requirements.

Cabinet

Figure 2:
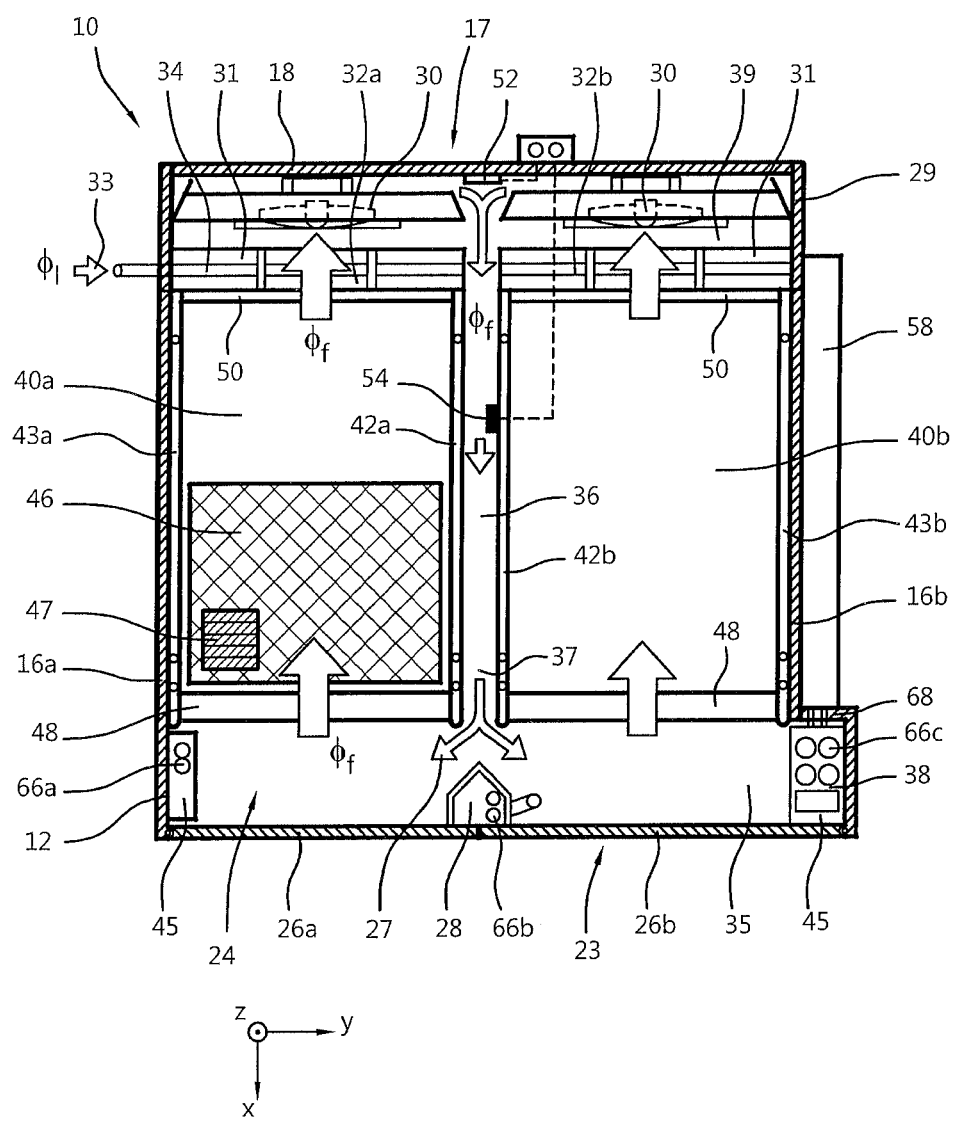
FIG. 2 presents top cross-sectional view of a cabinet according to an embodiment.
Figure 3:
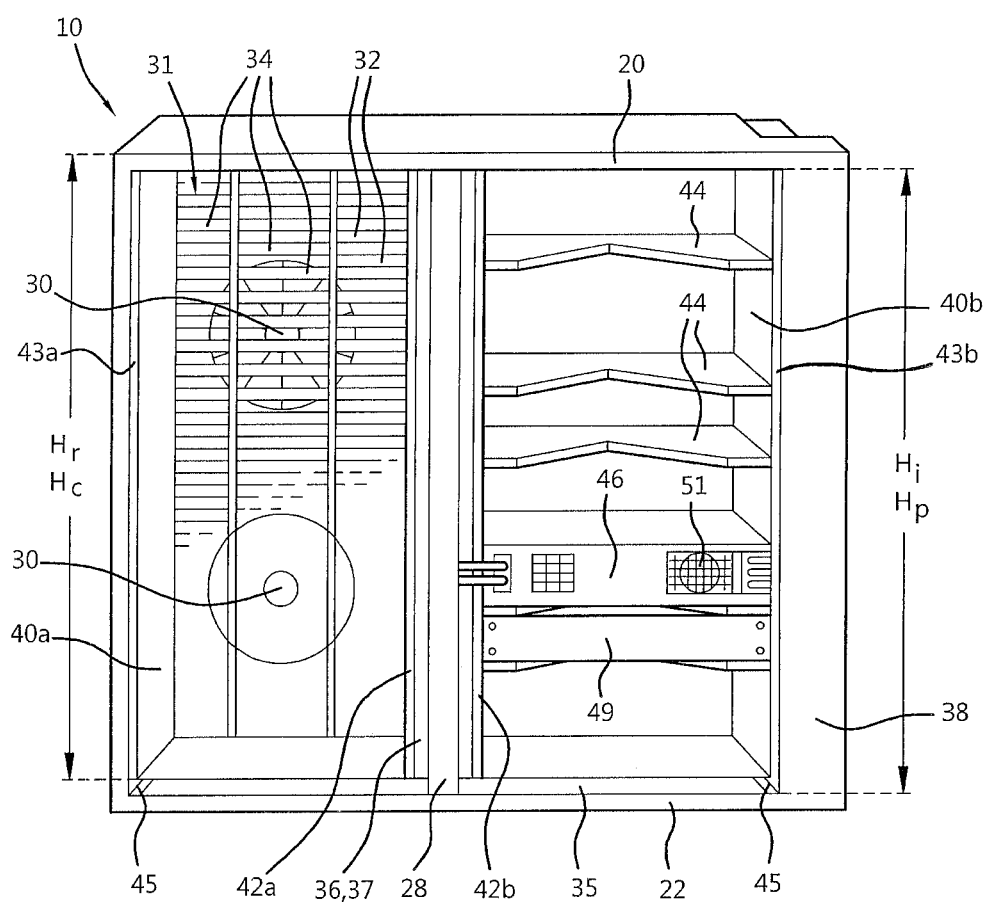
FIG. 3 shows a frontal view of a cabinet according to an embodiment.

FIGS. 2 and 3 schematically show a cross-sectional top view and a frontal view of a cabinet 10 according to an embodiment. The cabinet 10 includes the casing 12 for accommodating the electronic equipment 46. As shown in FIGS. 2 and 3, the cabinet 10 has an access side or front side 23, a rear wall 18, a first lateral wall 16a, a second lateral wall 16b opposite to the first lateral wall 16a, a top wall 20, and a floor 22. The front side or access side 23 of the casing 10 defines an opening 24, which provides access to the interior of the cabinet 10, and includes two doors 26a, 26b for covering the opening 24 in a sealing manner. The walls 16-22 and doors 26 of the cabinet 10 are formed by solid panels, which prevent air from the environment from entering the cabinet 10. A tandem of laterally spaced racks 40a, 40b is provided on the interior of the cabinet 10. Each rack 40 is provided with shelves 44 that during use of the cabinet 10 are populated with all sorts of electronic equipment 46a, 46b. Each rack 40 has rack walls 42a, 42b provided on lateral sides of each rack 40 and extending in the longitudinal and vertical directions X, Z. The shelves 44 are horizontally suspended between the rack walls 42, and are allowed to be vertically repositioned in any desired arrangement, so that electronic equipment 46 of various heights can be installed in the casing interior in any desired arrangement. The electronic equipment 46 includes electronic components 47 whose operation involves the motion of electrical charge carriers. The electronic components 47 generate heat, and typically require cooling to prevent component and system failure. The electronic components 47 may include, without limitation, any number of power supplies, integrated circuits, memory modules, magnetic or optical, solid state storage media, audio hardware and/or video hardware. The racks 40 may for example support servers which typically include one or more processors, memory modules, data storage means, and network controllers.

The casing walls 16-22 and doors 26 are arranged for keeping the casing 12 substantially air-tight. Each rack 40 defines front inlets 48 and rear outlets 50 between the shelves 44 associated with a front side and a rear side of the rack 40, viewed along the longitudinal direction X. These front inlets 48 and rear outlets 50 are initially open, but become substantially closed after being populated with various electronic devices 46. Each electronic device 46 may be provided with their own air supply and discharge openings (indicated by reference number 51 in FIG. 3), to draw in and expel the air 27 needed for cooling the internal electronic components 47. Any shelves 44 that are not populated by an electronic device 46 may be covered on front and/or rear rack sides with blind panels (reference number 49 in FIG. 3), in order to block the longitudinal partial passages inside the rack 40, and avoid the air 27 from flowing through such passages.

Two heat exchangers 31 provided with air apertures 32 are positioned on a rear side 17 of the cabinet 10 within the airflow Φf, and serve to absorb and thus remove thermal energy or heat Q from the flowing air 27 emanating from the rear outlets 50 and into the air apertures 32. The heat exchangers 31 extend over almost the entire rear side 17 of the casing 12, to provide a large heat exchanger area which allows a high cooling rate that is relatively uniformly distributed. Each heat exchanger 31 provides a linear grid of fluid conduits or tubes 34 along the lateral direction Y, which define the air apertures 32 between each pair of adjacent tubes 34. A second cooling fluid 33 flowing inside the fluid conduits 34 comprises water, and the heat exchangers 31 are air-to-water-type heat exchangers. The heat exchangers 31 are coupled to a closed-loop fluid circuit (not shown). The tube-type heat exchangers 31 are mounted inside the cooling frame 29 which is positioned against the rear side 17 of the casing 12. The back of the cooling frame 29 defines a rear wall 18 of the cabinet 10. A second plenum space (or "rear plenum space") 39 is defined between the heat exchangers 31 and the rear wall 18. The second plenum space 39 may be provided with funnel structures for guiding the airflow Φf towards the channel 36.

A plurality of fans 30 is provided inside the rear plenum space 39 of the cooling frame 29, and near the rear wall 18. The fans 30 are configured for generating a flow Φf of the air 27 inside the casing 12 in such a manner that the air 27 circulates across the one or more electronic components 47 in the racks 40. The fans 30 are positioned behind the air apertures 32 and tubes 34 of the heat exchanger units 31. The second plenum space 39 may comprise or be defined by funnel structures that guide the airflow from the air apertures 32 into the effective flow generation region of each fan 30.

A longitudinal air return channel 36 is formed (in this exemplary embodiment) by a space between the second rack wall 42a of the first rack 40a and the nearby first rack wall 42b of the second rack 40b. Rack walls 42a, 42b are formed by substantially closed panels that define boundaries of the channel 36 along the longitudinal and vertical directions X, Z.

In the embodiment of FIGS. 2 and 3, the channel 36 defines a gap with a rectangular horizontal cross-section, which extends in the longitudinal direction X from the second plenum space 39 to the first plenum space 35. The gap 36 also has a rectangular vertical cross-section defining a channel height Hc that substantially equals the internal height Hi of the casing 12 defined between inner surfaces of the top wall 20 and the floor 22. The first plenum space 35 has a plenum height Hp that also equals the internal height Hi of the cabinet 12.

A flow guiding beam 28 is provided at the center of the first plenum space (or frontal plenum space) 35 near the front doors 26, which extends in the vertical direction Z between the inner surfaces of the floor 22 to the top side 20. The flow guiding beam 28 has an inner space for accommodating power and/or signal cabling 66b for the electronic equipment 46. The flow guiding beam 28 directs the required cables 66b to the corresponding equipment positions, where the cables exit the beam 28 and are connected to selected front sides of the electronic equipment 46. Hence, the beam 28 efficiently combines the functions of guiding the airflow Φf and leading cables 66b to the respective connection sockets on the equipment 46.

The frontal plenum space 35 comprises a vertical recess 38 at a side wall 16b of the casing 12, for accommodating further cabling 66c for the electronic equipment 46 along the vertical direction Z. As shown in FIGS. 1-3, the vertical recess 38 defines a rectangular cuboid void that forms a lateral part of the frontal plenum space 35 near the side wall 16b. The vertical recess 38 extends vertically along substantially the entire side wall 16b of the casing 12, and has a height substantially equal to the plenum height Hp of the frontal plenum space 35. Upper and lower recess walls of this vertical recess 38 as well as a front recess wall and a rear recess wall 68 are in a projection of the frontal plenum space 35, while a lateral recess wall closes off the space between front and rear wall thereof. The lateral vertical recess 38 allows to direct signal and/or power cables 66c to and from the corresponding equipment 46 without obstructing the airflow Φf inside the casing 12, and in particular without inducing turbulences in the airflow Φf in the frontal plenum space 35. At the respective equipment locations, the cables 66c exit the vertical recess 38 to form a connection with a front side of a corresponding electronic equipment unit 46. By arranging the cables 66b, 66c and connections for the equipment 46 at the front of the cabinet 10, the need for accessing the equipment 46 from the rear side 17 of the cabinet 10 (e.g. during maintenance) is obviated. The recess 38, which is preferably included only at one lateral side of the cabinet 10, but may be included at each lateral side of the cabinet 10, is thereto provided with cable fastening means.

Near a bottom of the recess 38, the cabinet 10 comprises a floor aperture 45 in the floor 22, for guiding the cabling 66c out of the cabinet 10. These allow cables 66c and the like to be guided below the cabinet 10, as may be desired in various applications, e.g. for directing cables 66c to the rear side of the cabinet 10. The floor apertures 45 are included only at lateral sides of the front plenum 35, thereby maintaining full freedom of access to and for the lowermost equipment 46 in the cabinet 10. In case the cabinet 10 forms part of a lithography system (for example described with reference to FIGS. 5a and 5b), the cables 66c may be guided underneath and against the cabinet 10 in lateral inward direction so as to branch off to a relevant access port of a lithography vacuum chamber.

Multiple curved cable conduits or gutters 58, 59 branch off from the vertical recess 38 at various heights. In the embodiment of FIG. 1, each of the curved cable conduits 58, 59 is formed by metal plating mounted to the side wall 16b on the outside of the casing 12, thereby defining a curved channel with a rectangular cross-section. The curved cable conduits 58, 59 allow a desired portion of the cables 66c to be guided to locations below and outside of the casing 10, which are displaced with respect to the floor aperture 45 along the longitudinal direction X. The vertical recess 38 and curved cable conduits 58, 59 form an efficient cable distribution arrangement for a cabinet 10 that is mountable on top of a lower structure to which the cables 66c are meant to be connected at various locations, e.g. the vacuum chamber 4 in the corresponding lithography unit 2a-2b shown in FIG. 1.

Each vacuum chamber 4a, 4b in the lithography units 2a, 2b of FIG. 1 is provided on a top side 5 with a recessed section 7 that comprises an interface wall 6. The interface wall 6 comprises cable ports (not shown) for passing through portions of the cables 66a-66c that are connected to electronic equipment 46 inside the corresponding cabinet 10a, 10b. The cable ports comprise cable enclosing seals (not shown) for sealing an inside of the corresponding vacuum chamber 4a, 4b from the environment, so that a vacuum inside the chamber 4a, 4b can be maintained.

Lithography unit 2b comprises a duct 9 that is bounded by a lateral side of the corresponding vacuum chamber 4b, and which is adapted for accommodating portions of the cables 66c emanating from the curved cable conduits 58, 59, and for guiding the portions of the cables 66c to a lower part of the vacuum chamber 4b. The vacuum chamber 4b may comprise further cable ports with further cable enclosing seals (not shown) at a lower lateral side and/or floor side of the vacuum chamber 4b, for guiding the portion of cables 66c into the lower part of the vacuum chamber 4b.

Lithography unit 4a may comprise a similar duct 9 and corresponding cable ports. The described arrangement of cable conduits, ducts, and ports provides an efficient means for separating various cables 66 originating from the cabinet 10a, 10b, and for guiding these cables 66 towards distinct lithography modules and devices provided inside the corresponding vacuum chamber 4a, 4b. This cable separation may be particularly desirable in the cases that the various lithography modules and devices are located with significant interspacing inside the vacuum chamber 4a, 4b, that the various modules and devices are moveably positioned with respect to each other and mechanical coupling of the modules via the cables 66 needs to be avoided, and/or that the cable portions inside the vacuum chamber 4a, 4b need to be as short as possible in view of outgas sing of the cables required during vacuum pumping.

The cabinet 10 shown in FIG. 2 includes a temperature sensor 52, which is configured for measuring a temperature T within the casing 12, and for generating a temperature measurement signal representative of the temperature T. Based on the temperature measurement signal, a high-temperature indication may be provided that alerts an operator in the event of an increase in temperature within the casing 12. The high-temperature indication may for example assume the form of a sound alarm, or a visual indication on a front-panel of the casing 12. In addition, the cabinet 10 shown in FIG. 2 includes an airflow sensor 54, which is configured for locally measuring the airflow $\Phi f$ within the casing 12 (shown in the channel 36), and for generating a flow measurement signal representative of the airflow $\Phi f$. The temperature sensor 52 and the flow sensor 54 are in signal communication with a control unit CU. The control unit CU is furthermore in signal communication with the fans 30, and configured for controlling fan rotation speeds. Based on either the temperature measurement signal or the flow measurement signal (or both), the fan rotation speeds may be adjusted to adjust the magnitude of the airflow $\Phi f$ inside the casing 12.

Cooler Frame

Figure 4A:
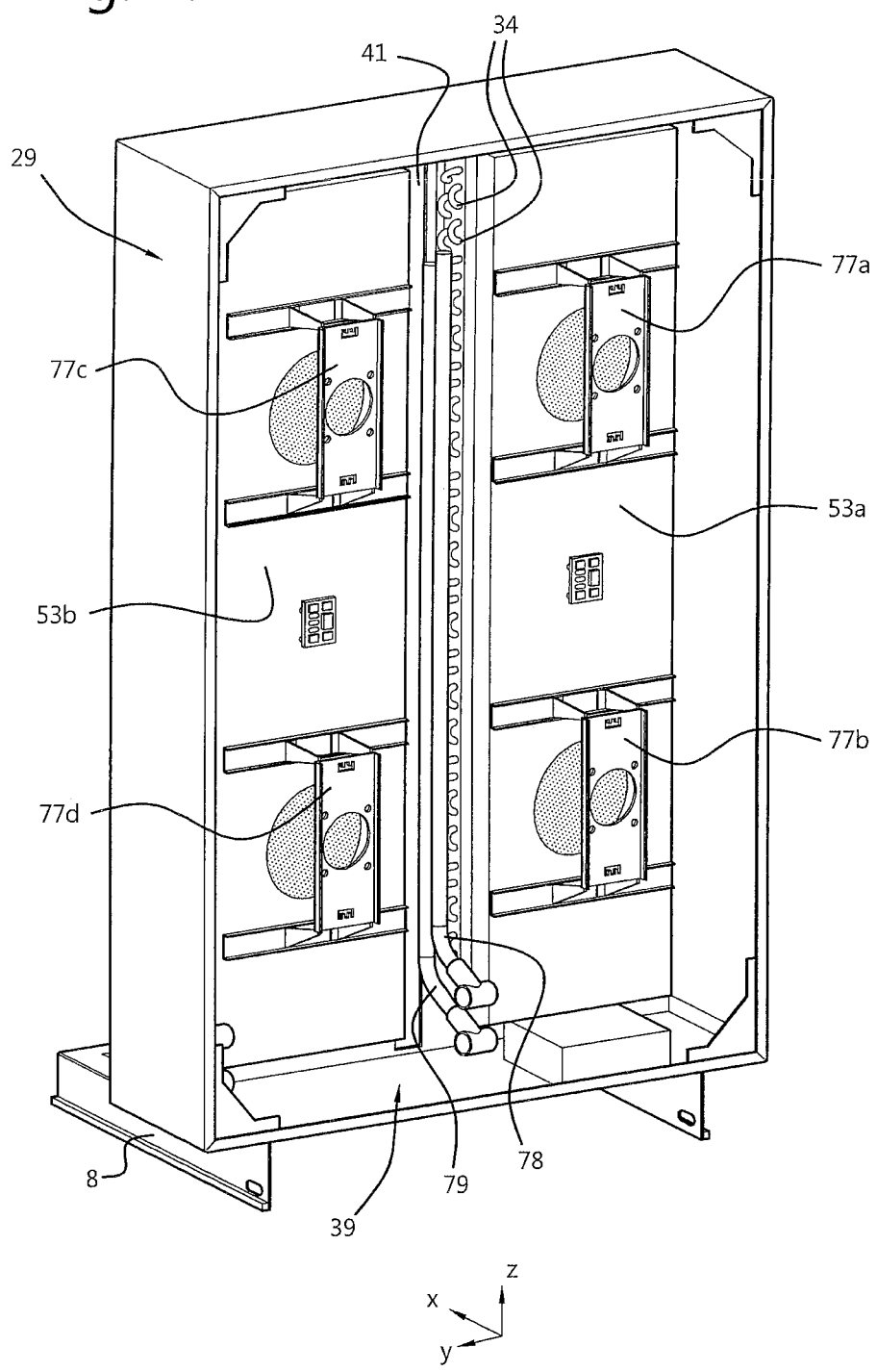
FIGS. 4a and 4b show perspective views of a cooler frame of a cabinet according to an embodiment.
Figure 4B:
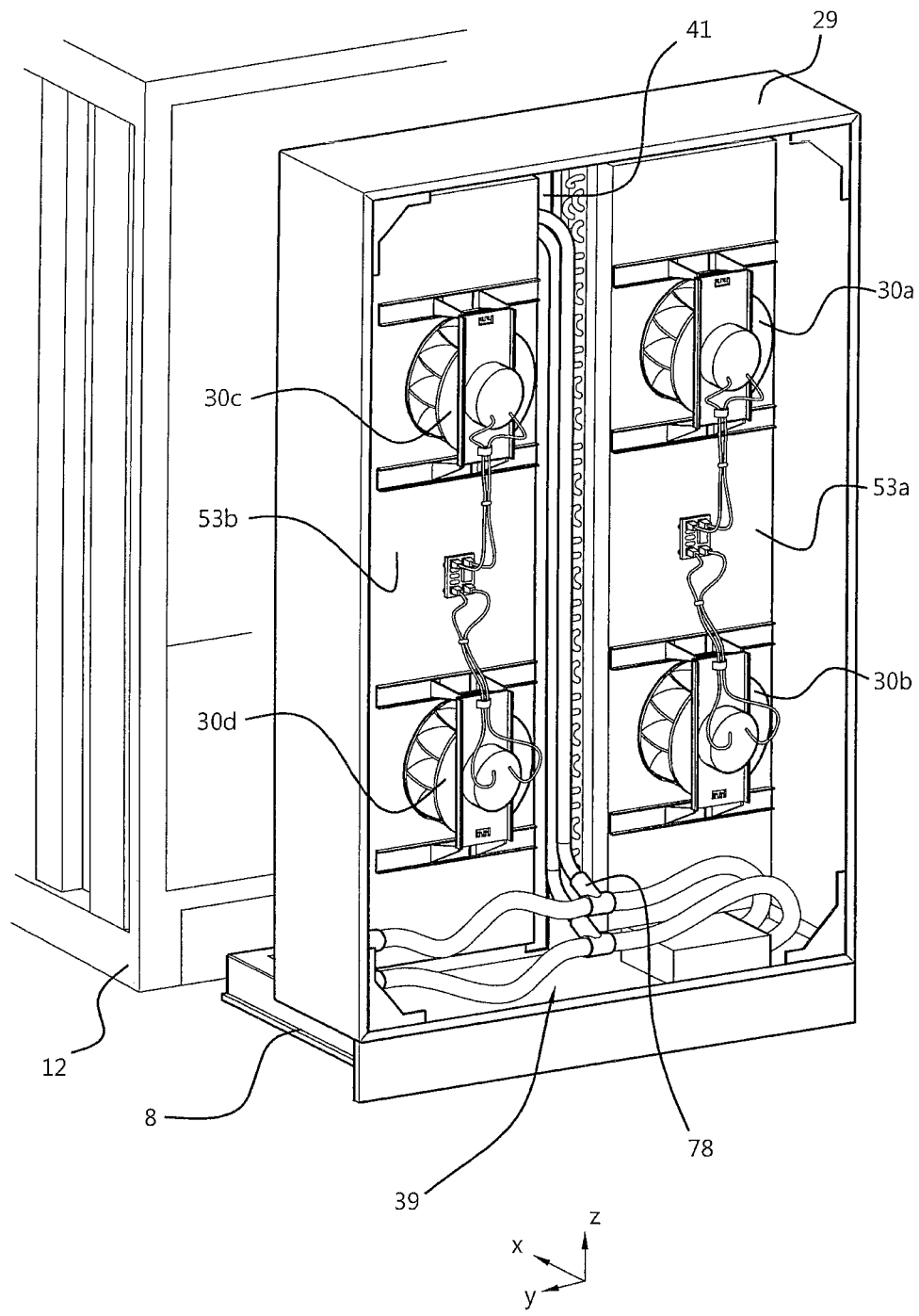

FIGS. 4a and 4b shows perspective rear views of a modular cooler frame 29 of a cabinet 10 according to an embodiment that is similar to the dual rack embodiment described with reference to FIGS. 1-3. The flow generator and the heat exchanger are integrated with the cooler frame 29, which is separately repositionable with respect to the cabinet casing 12. The repositionable cooler frame 29 extends substantially over the entire rear side 17 of the casing 12, to cover the rear side 17 and form a rear wall 18 of the cabinet (see for example FIG. 2).

The cooler frame 29 is shown with the rear wall 18 removed, to reveal the rear plenum space 39 that is bounded by vertical fan mounting panels 53a, 53b of the flow generator 30. The vertical fan mounting panels 53a, 53b comprise four fan mounting regions 77a-77d adapted for mounting an equal number of gas circulation fans 30a-30d. A cooler frame channel aperture 41 with an elongated rectangular shape in the vertical direction Z is provided laterally between the vertical fan mounting panels 53a, 53b and fan mounting regions 77a-77d. In the embodiment of FIGS. 4a-4b, the fans 30a-30d are centrifugal fans, each comprising an impeller with impeller blades that are curved in a radial and angular direction. The blades of each impeller are rotatable with respect to the respective fan mounting panel 53a-53b about a central shaft, and driven by an electromotor that is fixed to the respective mounting region 77a-77d. The heat exchanger 31 with gas apertures 32a, 32b and fluid conduits 34 are provided on a side of the fan mounting panels 53a, 53b that faces toward the positive longitudinal direction +X (not visible in FIGS. 4a-4b). The fan mounting regions 77a-77d comprise suitably shaped fluid transport apertures that enable the centrifugal fans 30a-30d to convey the gas (first cooling medium) 27 in an axial direction through the gas apertures 32a, 32b, along the fluid conduits 34, and through the fluid transport apertures beyond the fan mounting panels 53a, 53b. The rotating impeller blades of each centrifugal fan 30a-30d may then expel the gas 27 along a predominantly radial direction into the rear plenum space 39. Pressure buildup of gas 27 in the rear plenum 39 will cause the gas 27 to be expelled through the cooler frame channel aperture 41 into the channel 36. The fluid conduits 34 are connected to a fluid supply conduit 78 and a fluid discharge conduit 79. The fluid supply and discharge conduits 78, 79 may be connectable to a remote supply/drain and pumping mechanism (e.g. a cooling manifold) for the second cooling medium 33, which allows the second cooling medium 33 to be supplied to, circulated through, and subsequently discharged from the fluid conduits 34.

The cooler frame 29 is repositionably mounted with respect to the cabinet casing 12 e.g. by means of rails 8. The side of the cooler frame 29 facing towards the positive longitudinal direction +X is arranged to be positioned against the rear side 17 of the casing 12, with the gas apertures 32a, 32b positioned against corresponding rear sides of the racks 40a, 40b, and with a perimeter of the cooler frame channel aperture 41 positioned against corresponding lateral rack walls 42a, 42b that delineate the channel 36. Sealing members (100, not visible) may be provided around any one (or all) of the cooler frame channel aperture 41, the gas apertures 32a, 32b, and complementary engaging surfaces provided on the casing 12. For example, rectangular shaped O-rings or C-rings 100 may be provided around the cooler frame channel aperture 41 and the gas apertures 32a, 32b (as is for example shown in the embodiment of FIG. 8).

Cooling Method

One embodiment of a method for cooling the electronic equipment 46 comprises:

circulating within an enclosed cabinet 10 a gaseous first cooling medium 27 in thermal communication with heat generating electronic equipment 46, thereby heating the first cooling medium 27;

cooling the heated first cooling medium 27 with a heat exchanger arrangement 31, by transferring heat Q from the heated first cooling medium 27 to a second cooling medium 33, and recirculating the cooled first cooling medium 27 through a channel 36 back to a first plenum space 35 provided on an access side 23 of the cabinet 10.

Operation of the cabinet 10 and execution of the proposed cooling method are based on a substantially closed recirculating airflow within the casing 12, with air as a first cooling medium 27 that circulates within the cabinet 10. The airflow Φf generated by the fans 30 is substantially recirculated within the casing 12.

The cooling method is further explained with reference to the exemplary embodiment shown in FIG. 2, wherein the airflow Φf inside the casing 12 follows two closed loop paths in a horizontal plane. Initially, cool air 27 accumulates in the plenum space 35 near the access side or front side 23 at the front of the racks 40. Electronic equipment 46 with heat generating components 47 (or other heat generating devices) are accommodated in the rack 40 and carried by the shelves 44. During use, the fans 30 at the second side (rear side) 17 of the casing 12 induce the flowing Φf of the air 27 across the electronic equipment 46. The cool air 27 is drawn in by the electronic equipment 46 through the front inlets 48. The airflow Φf then flows from the front inlets 48 toward the rear outlets 50 across the heat generating electronic components 47, in the (horizontal) longitudinal direction X from a front side to a back side of each rack 40. To properly direct the airflow Φf across the electronic components 47, any number of flow guiding means (e.g. air deflectors, shrouds, manifolds) may be utilized. Thermal energy or heat Q generated by the electronic components 47 is transferred to the circulating airflow Φf as it passes through the rack 40, thereby cooling the electronic components 47. Propelled by the fans 30, the heated air 27 is discharged via the rear outlets 50.

The two heat exchangers 31 with air apertures 32 positioned within the airflow Φf on the second side or rear side 17 of the cabinet 10 serve to absorb and thereby remove heat Q from the flowing air 27 emanating from rear outlets 50 and into the air apertures 32. The air apertures 32 defined between fluid conduits 34 allow the airflow Φf to traverse the heat exchanger units 31 in order to transfer heat Q stored in the circulating airflow Φf to the second cooling medium 33 that is conveyed through the fluid conduits 34. The linear grid of fluid conduits 34 is in thermal communication with the air 29 flowing through the air apertures 32. The second cooling fluid 33 is actively pumped in and out of the heat exchangers 31 inside the casing 12 through the fluid conduits 34. The heat exchanger 31 is positioned in close proximity to an input region of the fans 30 that force the airflow Φf through the air apertures 32, so that the airflow Φf can be maximally cooled by the heat exchanger 31 prior to being recirculated through the channel 36 back to the front inlets 48 of the electronic equipment 46. Cooled water 33 passes through the tubes 34 of the heat exchanger units 31, and absorbs the heat Q from the air 27. By supplying water below room temperature, the same scheme may be used to lower the cooling air temperature within the closed loop and accommodate even higher power dissipation with air cooling.

The air 27 chilled by the heat exchangers 31 is redirected by the fans 30 via the channel 36 back into the plenum space 35 and to the front of the racks 40. Upon exiting the central channel 36, the cooled air flow Φf bifurcates into the first plenum space or frontal plenum space 35, thus completing the closed loop airflow Φf. The flow bifurcation is facilitated by the flow guiding vertical beam 28 located at the center of the front doors 26.

A single, horizontally disposed closed loop air flow path in the embodiment of FIG. 2 includes four 90 degree turns, one turn after exiting the channel 36 into the plenum space 35, one turn from the plenum space 35 into the front inlets 48 of the electronic equipment 46, one turn after the exiting the heat exchanger units 31, and one turn while entering the channel 36.

Lithography System

Figure 5A:
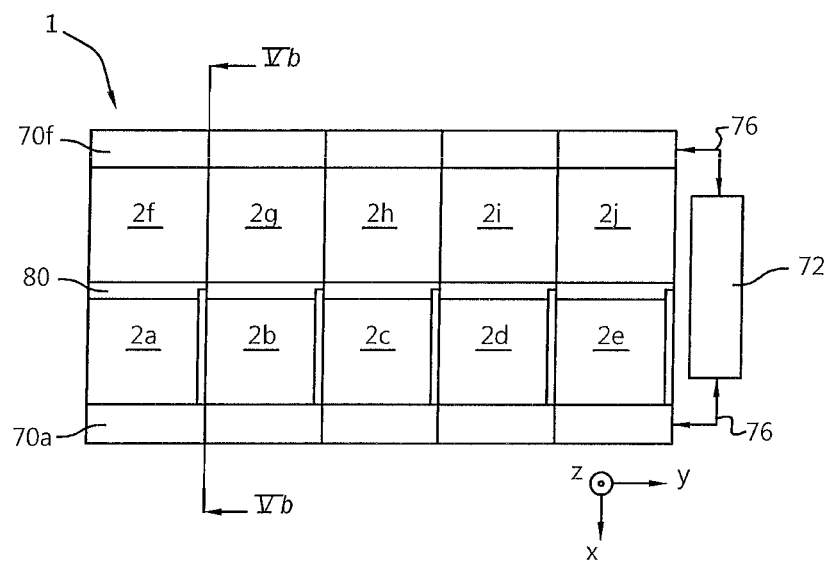
FIGS. 5a and 5b schematically show a top view and a cross sectional side view of a compound lithography system or cluster according to an embodiment.
Figure 5B:
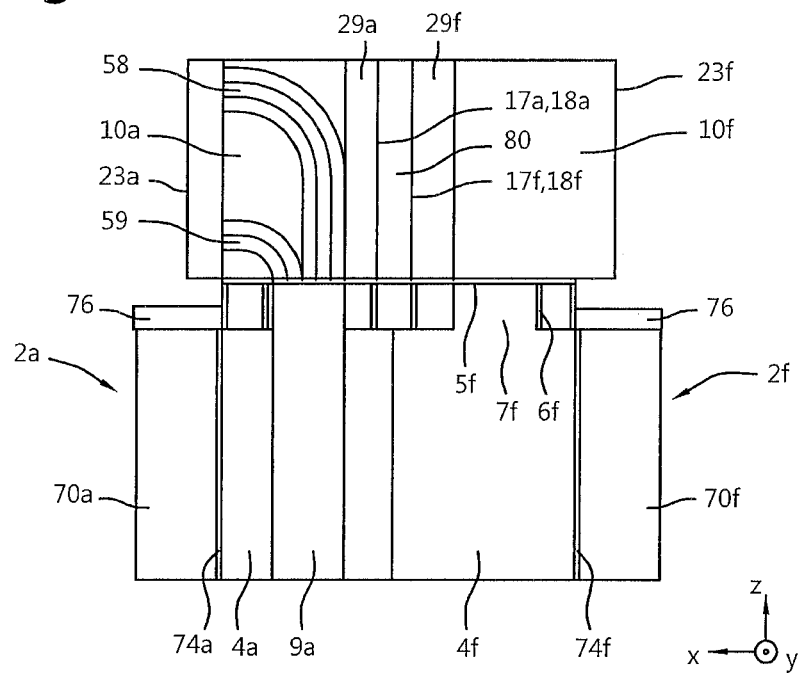

FIGS. 5a and 5b schematically show a preferred arrangement of multiple lithography units 2a-2j (generally indicated by reference number 2) that form a compound lithography system (or "cluster") 1.

The lithography units 2 in this lithography system 1 are each provided with a vacuum chamber 4, with on its top a cabinet 10 as described herein above. A back-to-back arrangement of lithography units without top-mounted electronic equipment cabinets has been disclosed in international application WO2012/080278, by the current assignee.

The lithography units 2 may be arranged side-to-side to form a row of units, viewed along the transversal direction Y. The unit rows may in addition be aligned back-to-back (in the longitudinal direction X), to form unit blocks. These unit rows and/or unit blocks may jointly form the lithography system 1 in an equipment room of a lithography facility or fab. The back-to-back layout of the lithography units 2 yields a lithography system 1 with a limited footprint corresponding to an efficient use of fab floor space.

FIG. 5a shows a top view of the lithography system 1, which in this particular embodiment comprises a group of ten lithography units 2a-2j, arranged back-to-back in two rows of five units, wherein the second sides or rear sides 17 of the cabinets 10 of each pair of longitudinally adjacent lithography units 2 face each other (in the longitudinal direction X).

The lithography system 1 further comprises a substrate supply system 72. The substrate supply system 72 is arranged to receive substrates to be processed by the lithography system 1, and to provide these substrates to the lithography units 2 for processing. The use of a substrate supply system 72 enables the lithography system 1 to efficiently cooperate with other equipment in the fab, as it allows for a relatively easy replacement of presently used lithography systems.

The back-to-back arrangement of two longitudinally adjacent lithography units 2a, 2f is illustrated by the side view in FIG. 5b. Each lithography unit 2a, 2f comprises its own vacuum chamber 4a, 4f, with a back side of each vacuum chamber 4 facing a lithography unit 2 in the other row (i.e. the adjacent lithography unit 2 in the longitudinal direction X). Electronic equipment cabinets 10a, 10f as described herein above are positioned on top of the respective vacuum chambers 4a, 4f. Each cabinet 10a, 10f is provided with a cooling arrangement 29a, 29f comprising a heat exchanger and a flow generator at second sides 17a, 17f of the respective cabinets 10a, 10f, these second sides 17a, 17f each being opposite to the respective access side or front side 23a, 23f of each casing 10a, 10f. The rear walls 18a, 18f defined by the respective cooling arrangements 29a, 29f face each other in the longitudinal direction X. Between the rear walls 18a, 18f, a cooling fluid circuit manifold 80 is provided. The fluid conduits 34 for the second cooling fluid 33 in the heat exchanger (see FIG. 2) are in fluid connection with the cooling fluid manifold 80. The fluidic circuit of the manifold 80 is configured for circulating the second cooling fluid 33 through the fluid conduits 34 of the connected heat exchangers in the cabinets 10.

In case of a charged particle lithography system, the vacuum chamber 4 preferably comprises all elements that enable lithography processing, including a charged particle source, a projector system for projecting charged particle beamlets onto a substrate to be patterned, and a moveable substrate stage. The side of the lithography unit 2 facing a free area provided for service purposes comprises a load lock system 70 for transferring substrates into and out of the vacuum chamber 4.

The lithography units 2 are each provided with a door 74 at the same side as the load lock system 70. The door 74 may be removably attachable, and may be removable in its entirety. The free area at the side at which the load lock system 70 and access door 74 are located preferably is sufficiently large to accommodate the footprint of the door 74 and the load lock 70. The lithography system 1 thus comprises a plurality of lithography units 2 having a load lock system 70 and a door 74 facing a service area surrounding the lithography system 1. Due to the "outward" orientation of the load lock systems 70 and doors 74, the lithography units 2 are directly accessible from the surrounding service area. Direct access simplifies servicing of the lithography system 1, and may reduce the downtime of the lithography system 1 or parts thereof. A single specific vacuum chamber 4 for servicing can be opened without affecting the throughput of other lithographic units 2 within the lithography system 1.

In the shown embodiment, the lithography system 1 further comprises a substrate transfer system 76 for receiving substrates from and/or sending substrates to the substrate supply system 72. The substrate transfer system 76 may take the form of a suitable conveyor system, for example a conveyor system that is arranged in a substantially horizontal direction above the load lock systems 70a, 70f of the lithography units 2a, 2f. As a result, the substrate transfer system 76 does not interfere with the doors 74a, 74f of the lithography units 2a, 2f, and the chamber doors 74a, 74f may be opened for servicing purposes while the substrate transfer system 76 can continue with the transfer of substrates between the substrate supply system 72 and the other lithography units 2.

In the lithography units 2a, 2f shown in FIG. 5b, the vacuum chambers 4a, 4f are each provided on a top side 5a, 5f with a recessed section 7a, 7f that is provided with an interface wall 6a, 6f. Each interface wall 6a, 6f extends over an entire width of the top side 5a, 5f of the respective vacuum chamber 4a, 4f, and is oriented in the vertical direction Z. The interface wall 6a, 6f is provided with access ports for receiving and passing through conduits and/or cables that are connected to electronic equipment inside the cabinet 10a, 10f positioned above the respective vacuum chamber 4a, 4f.

Each lithography unit 2a, 2f may similarly be provided with a further interface wall (not indicated) at a rear of the top side top side 5a, 5f of the respective vacuum chamber 4a, 4f. Similarly, the further interface wall may have further access ports for receiving and passing through conduits and/or cables.

Lithography unit 2a comprises a duct 9a that is bounded by a lateral side of the corresponding vacuum chamber 4a. Similar as in the embodiment described with reference to FIG. 1, the lateral duct 9a is adapted for accommodating portions of the cables 66c emanating from curved cable conduits 58, 59, and for guiding the cable portions to a lower part of the vacuum chamber 4a. The other lithography units 2b-2j may comprises similar lateral ducts 9.

A back-to-back arrangement with lithography units each including an electronic equipment cabinet having a cooling arrangement at a second or rear side, and wherein the rear sides of adjacent cabinets face each other, is considered to be inventive in and of its own right in the present context, and may be subject of a separate patent application.

Cabinet with Lateral Cable Conduits

Figure 6:
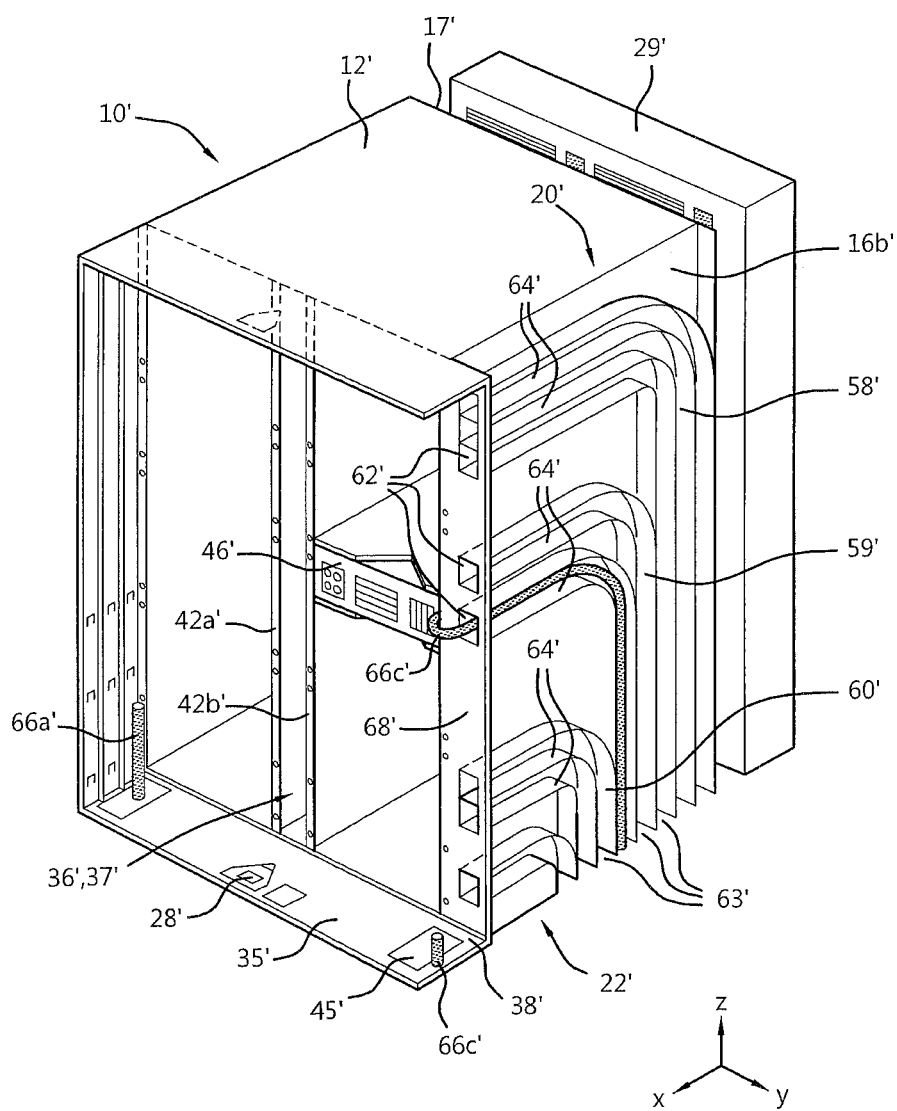
FIG. 6 schematically shows a perspective view of a cabinet according to an alternative embodiment.

FIG. 6 shows a perspective view of an alternative embodiment of a cabinet 10' that is similar to the cabinet 10 shown in FIGS. 1-3. A majority of features in the cabinet 10 that has already been described above with reference to FIGS. 1-3 may also be present in the cabinet 10' shown in FIG. 6, and will not be discussed here again. For the features that are discussed with reference to FIG. 6, similar reference numbers are used for similar features, but indicated by a prime to distinguish the embodiments.

Again, the first plenum space or frontal plenum space 35' in the casing 12' comprises a vertical recess 38' at a side wall 16b' of the casing 12', for accommodating cabling 66c' for the electronic equipment 46' along the vertical direction Z. Here, the vertical recess 38', which is part of the frontal plenum space 35', defines a rectangular cuboid void that vertically extends substantially along the entire side wall 16b' of the casing 12'. The vertical recess 38' directs signal and/or power cables 66c' (only partially shown) to a front side of a selected equipment unit 46'. In FIG. 6, a cooling arrangement 29' is again depicted at a longitudinal distance from the second side or rear side 17' (in a maintenance position), although it is understood that during cooling operation, the cooling arrangement 29' needs to be fixed against the rear side 17'.

A notable difference with the cabinet embodiments described above and the cabinet embodiment shown in FIG. 6, is that the side wall 16b' and the vertical recess 38' in FIG. 6 are arranged to be covered by an additional side plate (which is not shown in FIG. 6). Similar as in the previous cabinet embodiments, multiple curved cable conduits or gutters 58', 59', 60' branch off from the vertical recess 38' at various heights. It is shown in FIG. 6 that the vertical recess 38' is (in part) defined by a vertical recess wall 68' that comprises a plurality of conduit apertures 62' provided along the vertical direction Z. The curved cable conduits 58', 59', 60' open up in floor conduit apertures 63' at various locations along a longitudinal edge of the floor 22' of the casing 12'. This configuration allows desired functional groups or portions of the cables 66c' to be guided toward predetermined lower locations outside of the casing 12', which are displaced along the longitudinal direction X with respect to the floor aperture 45'.

Each curved cable conduit 58', 59', 60' is delimited by two elongate wall members e.g. bent metal strips 64' that are fixed to the side wall 16b' of the casing 12'. The curved conduits 58', 59', 60', which are mounted on an outside of the side wall 16b', keep the cables 66c' spatially separated and electromagnetically shielded from the contents of the casing 12'. The metal strips 64' may for example be welded in a substantially perpendicular orientation and along a curved trajectory onto an outer surface of the side wall 16b'. Each bent metal strip 64' extends along a respective curved trajectory from a conduit aperture 62' to a floor conduit aperture 63'. Two adjacent metal strips 64', the side wall 16b', and the side plate (not shown) jointly define one cable conduit 58', 59', 60', which forms a downward curved channel with a rectangular cross-section, in which a cable 66c can be accommodated.

In the embodiment shown in FIG. 6, an upper cable conduit 58' that opens up in a higher conduit aperture 62' (i.e. higher in the vertical direction Z along the recess wall 68') terminates in a distant floor conduit aperture 63' (i.e. further away from the floor aperture 45' in the longitudinal direction X). Conversely, a lower cable conduit 60' that opens up in a lower conduit aperture 62' terminates in a proximate floor conduit aperture 63'.

In general, a wall member 64' may delimit at least one cable conduit 58', 59', 60'. In some cases, a single wall member 64' may simultaneously delimit two adjacent cable conduits 58', 59', 60' on each side thereof. This reduces the amount of wall material required to form adjacent cable conduits 58', 59', 60'. For example, the three upper cable conduits 58' shown in FIG. 6 are bounded by only four metal strips 64' (i.e. two outer metal strips and two intermediate metal strips).

Preferably, as shown in FIG. 6, the curvature of the metal plate trajectory of each curved cable conduit 58', 59, 60' is smooth. A smooth trajectory allows any cable 66c to be manually inserted at one conduit end (i.e. one of the apertures 62', 63') and be gently conveyed through the cable conduit 58', 59, 60', and exit at the other conduit end (i.e. the corresponding aperture 63', 62') without getting obstructed.

In other embodiments, another vertical recess with cable conduits branching off from this other vertical recess (similar to the configuration described with reference to FIG. 6) may alternatively or in addition be provided at the opposite side wall of the casing. Furthermore, in any of the cabinet embodiments, at least one of the cable conduits may branch off via a conduit aperture in any vertical recess, to curve into an upward direction toward a top conduit aperture provided along a longitudinal edge of the top wall of the casing. Correspondingly, elongate wall members or metal strips may be welded in a substantially perpendicular orientation along an upward curved trajectory onto the respective side wall.

The at least one vertical recess with cable conduits branching off from the vertical recess yields an efficient frontal cable attachment and lateral cable distribution arrangement for a cabinet that is stackable on top of and/or below (an) other structure(s). With the described cable attachment and distribution arrangement, the cables may be kept electromagnetically shielded as well as spatially separated from the contents of the casing. The spatial separation ensures that any obstruction by the cables of the circulating cooling fluid inside the casing is minimized.

This attachment and distribution arrangement generally reduces or may even eliminate the need for accessing the equipment from the second side or rear side of the cabinet, for example during maintenance, even without the presence of any cooling arrangement inside the cabinet. Therefore, the configurations for a cabinet provided with lateral cable guiding channels defined by a vertical recess in a first plenum space and/or by one or more cable conduits mounted in or onto at least one side wall of the casing, as have been described herein above, do not require the presence of the cooling arrangement, and may be subject of a separate patent application.

Single Rack and Lateral Corridor

Figure 7:
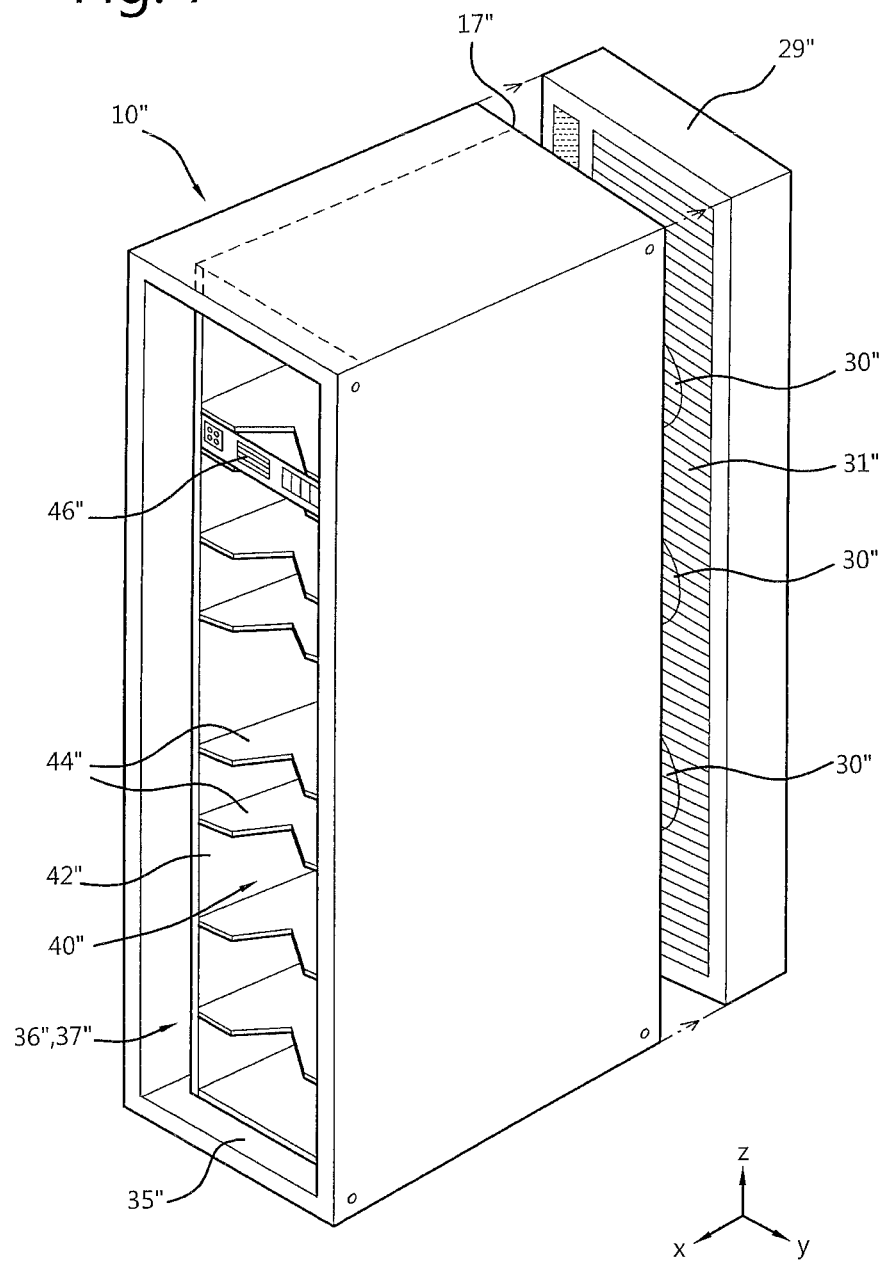
FIG. 7 schematically shows a perspective view of a cabinet according to yet another embodiment.

Those skilled in the art and informed by the teachings herein will realize that the invention is also applicable to any cabinet (housing, enclosure, or grouping thereof) accommodating components, for which cooling of heat generated by the components is desired, e.g. a computer data center, or telecommunications central office. For example, FIG. 7 presents a "non-set-top" configuration for a cabinet 10", which comprises a closable casing 12" defining an interior, which accommodates a single electronic equipment rack 40". The rack 40" supports shelves 44" for housing electronic equipment 46" at various heights inside the casing 12". The cabinet 10" is provided with a separate cooler frame 29", which is mountable at a second side or rear side 17" of the casing 12". The cooler frame 29" comprises multiple air circulators 30" and a heat exchanger 31" that extends over the entire rear side 17" of the casing 12". A channel 36" is defined along the longitudinal direction X along a side wall of the casing 12". The channel 36" extends from a first plenum space or frontal plenum space 35" defined on a front side of the rack 40" to the rear side 17" of the casing 12", and is laterally and vertically bounded by a rack wall 42". The cabinet 10" in FIG. 7 provides a similar longitudinal cooling arrangement for inducing a closed-loop horizontally circulating flow of a first cooling medium (that flows through the channel 36", into the frontal plenum space 35", and across the electronic equipment 46" back toward the air circulators 30" and heat exchanger 31") as was already described herein above, and is highly suitable for use in a computer data center. Embodiments of a "non-set-top" cabinet similar to the cabinet 10" shown in FIG. 7 may also involve a tandem rack configuration as well as other features that were already described with reference to FIGS. 1-4.

Rack Wall Panel with Recessed Wall Profile

In any of the abovementioned cabinet embodiments, a longitudinal fluid return channel is formed by a space between at least one lateral rack wall and a nearby wall (e.g. a rack wall of an adjacent rack). Any one of the rack walls may be formed by a substantially closed panel that defines a boundary of the channel along the longitudinal and vertical directions.

Figure 8:
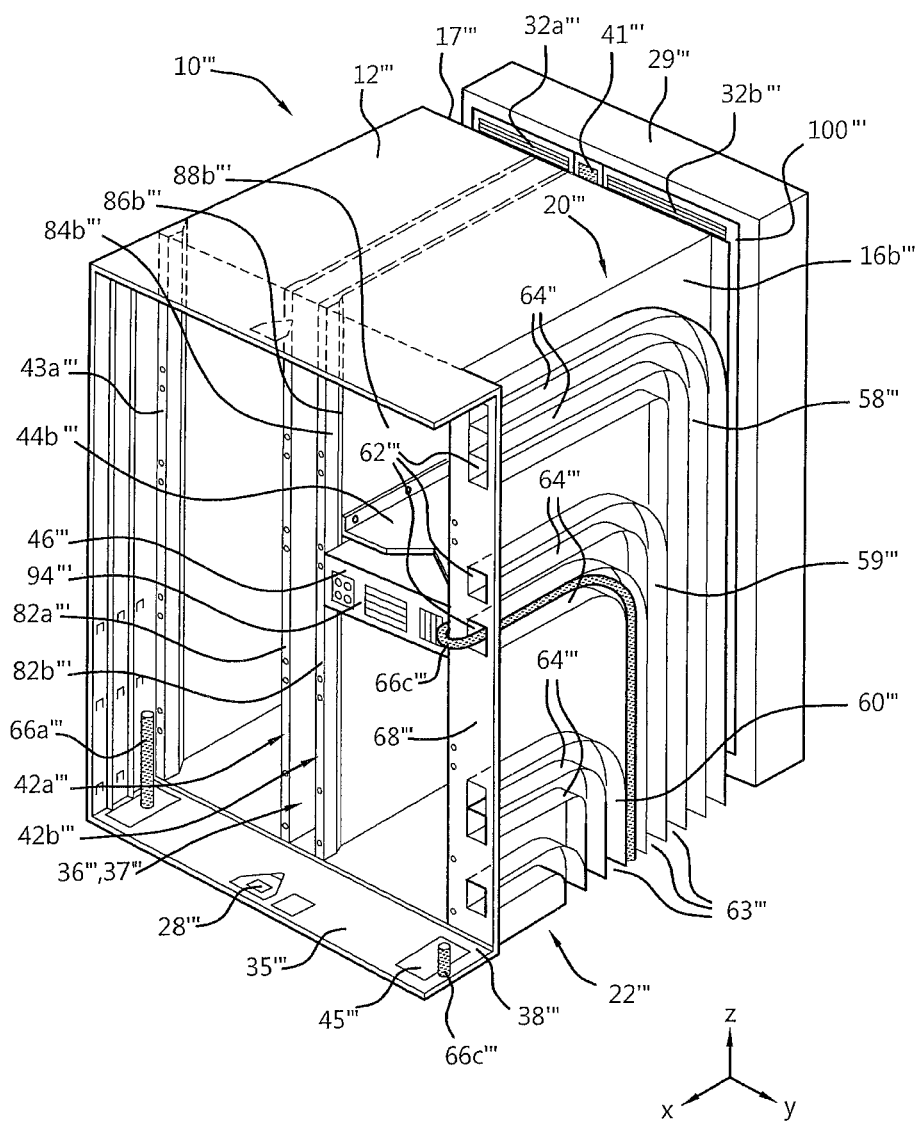
FIG. 8 shows a frontal perspective view of a cabinet according to another embodiment.
Figure 9:
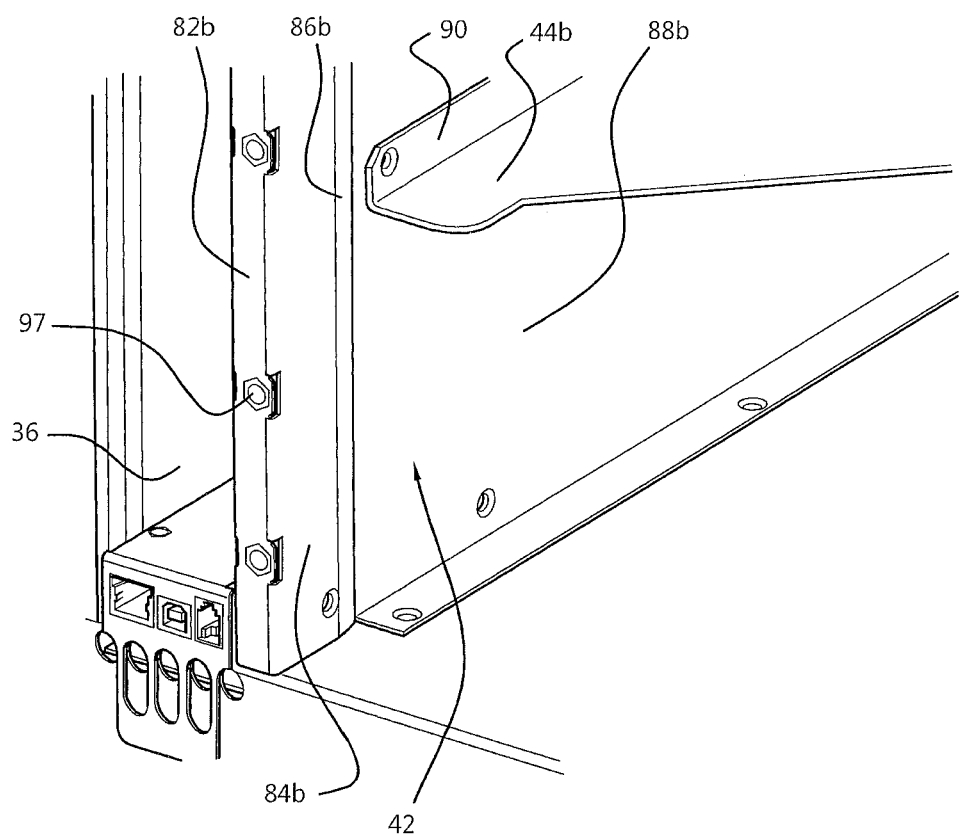
FIG. 9 shows a partial frontal perspective view of a cabinet according to the embodiment shown in FIG. 8.
Figure 10A:
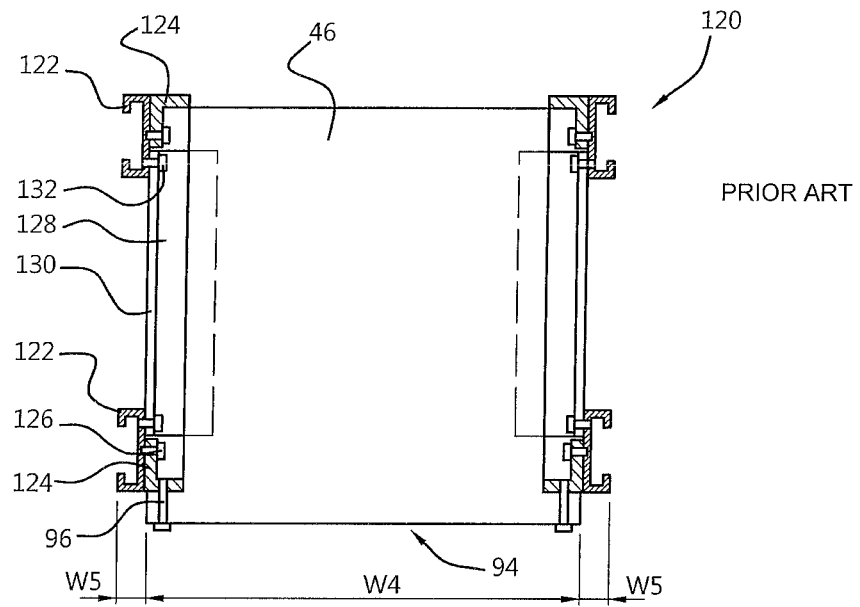
FIG. 10a shows a top cross-sectional view of a prior art equipment rack compliant with the 19-inch standard.
Figure 10B:
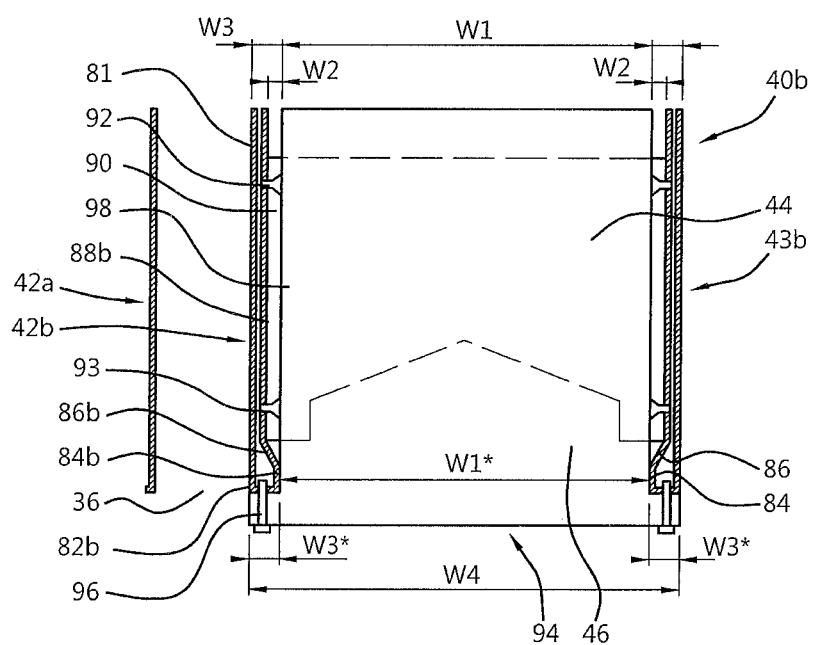
FIG. 10b shows a top cross-sectional view of a equipment rack according to an embodiment of the invention.

FIGS. 8, 9, and 10b illustrate advantageous rack wall adaptations which are implemented in embodiments that resemble the embodiment described with reference to FIG. 6. These wall adaptations may be applied in any of the described embodiments, though. The majority of elements is similar and not described again here. Similar reference numbers are used to indicate similar elements.

FIGS. 8, 9, and 10b show embodiments of the cabinet 10' comprising rack walls 42b''' having a recessed profile 84b'-88b'''. In FIG. 8, a wall header 82b' is located on a front side of the cabinet 10''', so as to face the frontal plenum space 35'''. The rack wall 42b''' comprises a recessed profile 84b'''-88b''' on a side that faces laterally away from the channel 36'. Corresponding perspective and top cross-sectional views are shown in FIGS. 9 and 10b respectively (the accents have been omitted from the reference numbers here). The recessed profile 84b'''-88b''' comprises a header wall portion 84b''', a recessed wall portion 88b''', and a receding wall portion 86b''' that interconnects the header wall portion 84b''' and the corresponding receding wall portion 86b' in a linear, curving or similar manner that generally does not protrude laterally beyond the bounds defined by the header wall portion 84b'''.

The header wall portion 84b''' is located at a respective wall header 82b''' of the lateral rack wall 42b''', and is positioned with a sufficiently large intra header distance W1* from a laterally opposite wall 43b''' of the same rack 40''' to allow electronic equipment 46 with a width W1 (measured from one equipment side wall 98 to an opposite wall of the same equipment unit) to be accommodated between the walls of the same rack 40. Preferably, the intra header distance W1* is minimal, and substantially equal to the equipment width W1 (with a difference in the order of millimeters or less), resulting in an (almost) touching arrangement between the header wall portion(s) 84b''' and a nearby lateral equipment wall 98 of electronic equipment 46 positioned within the rack 40b.

The wall header 82b''' has a header width W3*. The recessed wall portion 88b''' is substantially parallel but flush with respect to the corresponding header wall portion 84b'''. Consequently, the rack wall 42b' is laterally thinner in the region spanned by the recessed wall portion 88b''', and defines a lateral space between the recessed wall portion 88b''' and the corresponding header wall portion 84b'''. This lateral space has a width W2 and is adapted for accommodating one or more shelf mounts 90. The shelf mounts 90 are required for fixing a shelf 44b''' to an inside of the corresponding rack wall 42b'. The shelf mount 90 may for example comprise a mounting strip (e.g. and upwards or downwards bent flange of the shelf 44b''') having a width that (almost) corresponds to the space width W2. As a result, an exposed lateral surface of a mounting strip fixed to the recessed wall portion 88b''' on the one hand and the header wall portion 84' on the other hand will both span the same plane (along the longitudinal and vertical directions X,Z). The lateral equipment wall 98 that is (almost) touching the header wall portion 84b''' will therefore also be (almost) touching this lateral surface of shelf mount 90. The shelf mount 90 may be connected to the corresponding recessed wall portion 88b''' of the rack wall 42b''' by means of shelf connectors 92 (e.g. bolts provided through holes in the mounting strip) and complementary shelf connectors 93 (e.g. bolt holes or nuts provided in the recessed wall portion).

The equipment 46 has a front panel 94''' that spans a predefined panel width W4 which exceeds the equipment width W1. The panel width W4 preferably has a standardized value, e.g. the standardized width of 19 inches. The equipment panel 94''' comprises lateral flanges, each having a panel width W3 that is substantially equal to a header width W3*. The wall header 82b''' is arranged to abut with the equipment panel 94'' ' at a rear side of a lateral panel flange. Consequently, the panel flange of an equipment unit 46 that is mounted in the rack 40b''' will form an longitudinal extension of the channel wall portion 81, thereby minimizing the required lateral space while leaving a gas flow through the channel 36 unobstructed. Panel connectors 96 (e.g. bolts) may be used to removably fix the equipment panel 94'' ' to further panel connectors 97 (e.g. threaded mounting holes) provided in the wall header 82b'''.

As shown in FIG. 10b, a similar recessed wall profile may be provided at the opposite rack wall 43b''' that borders the side wall 16b''' of the cabinet 10'''. Alternatively or in addition, similar recessed profiles may be provided at the rack walls 42a''', 43a''' in an adjacent rack 40a''' that may be present in the cabinet 10'''.

The rack wall configurations with recessed profiles may be advantageously implemented in any of the cabinet embodiments that have been described herein above. In general, the rack wall configuration with recessed profile assists in efficiently accommodating electronic equipment inside the cabinet by efficiently integrating the equipment shelf connectors, the rack wall panels, and the fluid channel for re-circulating a cooling fluid. This results in an integrated cabinet configuration that minimizes the required lateral space taken up by the cabinet as a whole, while cooling fluid circulation inside the cabinet is optimized. It is understood that the abovementioned integration is achievable also in a rack mounting arrangement that is made compliant with the dimensions in the international 19-inch rack standard IEC 60297-3-100. Efficient usage of cabinet space and standardized equipment dimensions are highly beneficial in lithography applications, where both modularity and limited fab floor space usage significantly reduce the operational costs of the processing system.

Prior Art Rack

In FIG. 10a, a top cross-sectional view of a prior art equipment rack 120 according to the 19-inch standard is shown, to illustrate differences with the rack wall with recessed profile according to embodiments of the invention that have been described herein above. The prior art rack 120 comprises four rectangular C-shaped struts 122 at corners of the rack 120. An L-shaped mounting bracket 124 is fixed to each strut 122 along its vertical length by mounting bracket connectors 126 (bolts for example). Each L-shaped mounting bracket 124 comprises an inwardly directed flange with mounting holes at standardized vertical distances. The front panel 94 of an electronic equipment unit 46 is fixed to the L-shaped mounting bracket 124 by means of panel connectors 96 (e.g. bolts). Each pair of struts 122 are interconnected along a longitudinal direction by means of a vertical flange 130 that forms part of an equipment support bracket 128 which serves to support the equipment unit 46 in a vertical direction. Each vertical flange 130 is connected to two corresponding struts 122 by means of bracket connectors 132 (e.g. bolts). The mounting bracket 124 and corresponding struts 122 account for an additional width W5 on each side of the equipment panel 94, and cause a total prior art rack width to be larger than the achievable width for the recessed wall profile according to embodiments of the invention.

Flow Guiding Beam

Figure 11:
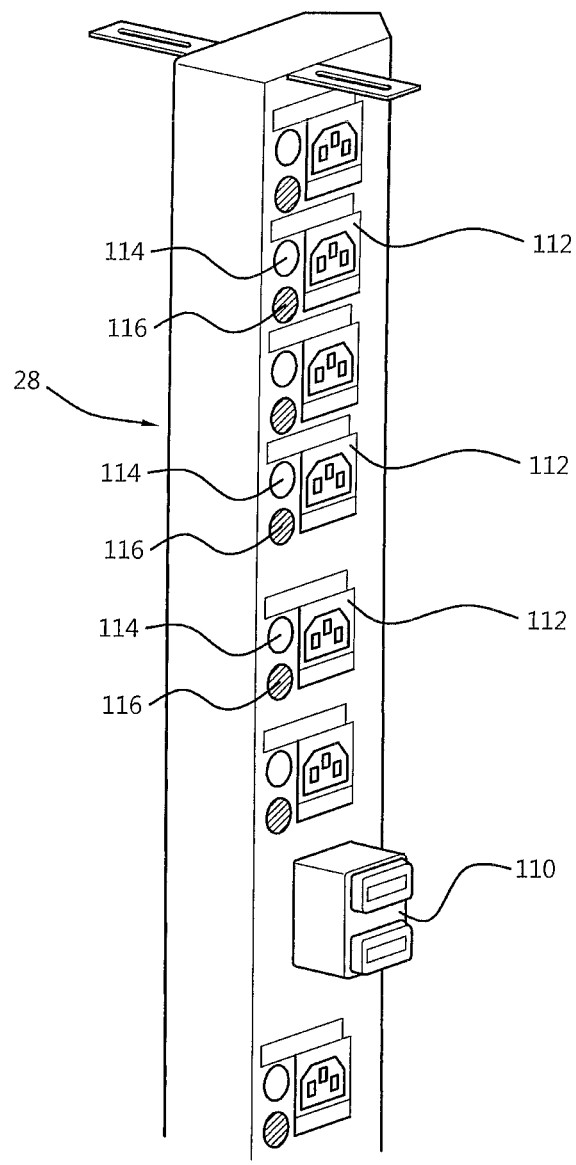
FIG. 11 shows a frontal perspective view of a flow guiding beam of a cabinet according to an embodiment.

FIG. 11 shows a frontal perspective view of a flow guiding beam 28 of a cabinet 10 according to an embodiment. The flow guiding beam 28 is adapted to be mounted directed along a vertical direction and in the frontal plenum space 35 at the access side 23 of the cabinet 10, in a manner shown in FIGS. 1-3. The flow guiding beam 28 is provided with a power supply socket 110 for connecting to a power supply (not shown) that may be provided on a dedicated shelf 44 in the rack(s) 40 of the cabinet 10. On an inside, the flow guiding beam 28 provides a space for accommodating power cables 66b that are guided from the power supply socket 110 towards power sockets 112 provided along a length of the beam 28, to provide power connections for various equipment units 46 that may be provided on various other shelves 44 in the rack(s) 40 of the cabinet 10. Safety fuses 114 and/or power monitoring indicators 116 may be provided along the beam 28 for several or all of the power sockets 112.

The descriptions above are intended to be illustrative, not limiting. It will be apparent to the person skilled in the art that alternative and equivalent embodiments of the cabinet 10 and cooling method can be conceived and reduced to practice, without departing from the scope of the claims set out below.

In general, any reference herein above to particular electronic equipment stored within racks is intended be broadly construed as referring to any type of equipment comprising heat generating components (electrical, optical, computing, etc.).

In the descriptive embodiments presented above, air represents the first cooling medium recirculated through a cabinet. However, in other embodiments, other gases may be used as recirculating cooling media. Any gas having a heat capacity that is similar to or greater than the heat capacity of ordinary air may be used for this purpose. Such other gases may for example include Helium.

Similarly, the second cooling medium used by the heat exchanger may comprise either a single phase fluid or an evaporating/condensing fluid and vapor mix. Accordingly, the heat exchanger arrangement inside the cabinet may include an internal gas-to-liquid or a gas-to-liquid-and-vapor type heat exchanger.

The second cooling medium may also contain a phase change material (PCM), for example polymer-encapsulated phase change material (e.g. a two-phase wax dispersion in fluid such as water). The use of a PCM increases the heat capacity of the second cooling medium by utilizing a portion of the transferred thermal energy for inducing a phase change in the PCM (e.g. melting), which phase change may be reversed again by further cooling elsewhere outside of the cabinet.

An external cooling device may be provided outside of the casing, for example in a different room than in which the lithography system 1 of FIGS. 5a-5b is located. The external cooling device assists in dissipating the thermal energy from the second cooling fluid, and may comprise a further heat exchanger, refrigerator, compressor, or the like.

In other embodiments, other types of heat exchanger may be provided as alternative or in addition to the abovementioned gas-to-fluid heat exchangers. The heat exchanger may for example comprise a thermoelectric device, like a Peltier effect cooling device. A Peltier cooling element typically includes a cooling surface and a heat dissipation surface, which are typically made of ceramic. According to known operation of a Peltier element, heat can be transferred from the cooling surface to the heat dissipation surface by applying a DC voltage to a semiconductor provided between the surfaces. The cooling surface of the Peltier element is positioned near the rear wall of the casing such that the airflow passes across it. In contrast, the heat dissipation surface is isolated, and positioned away, from the airflow. The heat dissipation surface may be further attached to a heat conductor that advantageously transfers the heat to a position external to the cabinet, where the heat can be conveniently dissipated.

Irrespective of the presence of cooling means in a cabinet, it may generally be desirable to provide a layout of electronic components and cabling inside the cabinet that is optimized for a side-by-side cabinet arrangement with a minimal footprint. A set of clauses is presented directly below, which defines aspects and embodiments that may be subject of a divisional application.

CLAUSES c1: Cabinet (10) for accommodating electronic equipment (46), wherein the cabinet comprises:
   a casing (12) comprising an access side (23) provided with an opening (24) for accessing the interior of the casing, and a second side (17) opposite to the access side;
   a rack (40a) for accommodating the electronic equipment (46) inside the casing, and positioned within the casing to define a first plenum space (35) between the access side and the rack;
   characterized in that
   the first plenum space (35) comprises a vertical recess (38) at a side wall (16) of the casing (12), for accommodating cabling (66c) for the electronic equipment (46) along a vertical direction (Z).

c2. Cabinet (10) according to clause c1, wherein the vertical recess (38) defines a rectangular cuboid void that forms a lateral part of the first plenum space (35) near the side wall (16).

c3. Cabinet (10) according to clause c1 or c2, wherein the vertical recess (38) extends vertically along substantially the entire side wall (16), and has a height along the vertical direction (Z), which is substantially equal to a plenum height (Hp) of the frontal plenum space (35).

c4. Cabinet (10) according to any one of clauses c1-c3, comprising a floor aperture (45), for guiding cabling (66c) accommodated in the vertical recess (38) to a lower outside of the cabinet.

c5. Cabinet (10) according to clause c4, wherein the floor aperture (45) is provided at a lateral end of the first plenum space (35).

c6. Cabinet (10) according to any one of clauses c1-c5, comprising at least one cable conduit (58, 59, 60) that branches off from the vertical recess (38), wherein the at least one cable conduit is formed by a conduit that is mounted on the side wall (16) on an outside of the casing (12).

c7. Cabinet (10) according to clause c6, wherein the at least one cable conduit (58, 59, 60) is curvedly shaped, preferably with a smooth curvature.

c8. Cabinet (10) according to clause c6 or c7, wherein the at least one cable conduit (58, 59, 60) is directed downwards in the vertical direction (Z).

c9. Cabinet (10) according to any one of clauses c6-c8, wherein the at least one cable conduit (58, 59, 60) is formed by bent upper and lower walls (64) included in between an inner wall pane and an outer wall pane of the side wall (16).

c10. Cabinet (10) according to clause c9, wherein the bent upper and lower walls (64) of the at least one cable conduit (58, 59, 60) terminate in the vertical direction (Z).

c11. Cabinet (10) according to any one of clauses c1-c10, wherein a side wall of the vertical recess (38) is provided with at least one cable mount.

c12. Cabinet (10) according to clause c11, wherein the at least one cable mount is provided in or near a height range for a predetermined electronic equipment unit (46), for allowing cabling (66c) to be branched off the vertical recess (38) in a lateral direction (Y) at the height range in which the electronic equipment unit is accommodated in the cabinet.

c13. Cabinet (10) according to any one of clauses c1-c12, wherein the cabinet (10) is configured for enclosing a first cooling medium (27) in thermal communication with the electronic equipment (46), and wherein the cabinet comprises:
a flow generator (30) for generating a flow (11f) of the first cooling medium (27) from the first plenum space (35) across the electronic equipment (46) towards the second side (17);
a heat exchanger (31) for extracting thermal energy (Q) from the first cooling medium (27);
wherein the heat exchanger (31) and the flow generator (30) are provided at or near the second side (17) of the casing (12), and wherein the casing comprises a channel (36) in fluid communication with the second side (17) and the first plenum space (35), for re-circulating the first cooling medium (27) from the second side (17) to the first plenum space (35).

c14. Cabinet (10) according to clause c13, wherein the rack (40) comprises opposing side walls (42), wherein at least one side wall comprises a substantially closed panel that defines a vertical boundary of the channel (36).

c15. Cabinet (10) according to clause c13 or c14, wherein the cabinet comprises a further rack (40b) that is arranged inside the cabinet, and is laterally separated from the rack (40a), thereby defining the channel (36) between the rack and the further rack along a longitudinal centerline of the cabinet.

c16. Cabinet (10) according to any one of clauses c13-c15, wherein the cabinet has an internal height (Hi) defined between inner surfaces of a top wall (20) and a floor (22) of the casing (12), and wherein the channel (36) defines a vertical gap with a channel height (Hc) that equals the internal height (Hi).

c17. Cabinet (10) according to any one of clauses c13-c16, comprising a flow guiding beam (28) arranged in the first plenum space (35) along a frontal aperture (37) of the channel (36), for regularizing the re-circulating flow (11f) of the first cooling medium (27) into the first plenum space.

c18. Cabinet (10) according to clause c17, wherein the flow guiding beam (28) extends between the top wall (20) and the floor (22) of the casing (12), wherein the flow guiding beam if formed as a hollow member for accommodating and guiding at least one cable (66b) between the top wall (20) and the floor (22).

c19. Cabinet (10) according to any one of clauses c13-c18, wherein the first cooling medium (27) is a gas, wherein the heat exchanger (31) is a gas-to-fluid heat exchanger configured for transferring the thermal energy (Q) to a second cooling medium (33) comprising a fluid.

c20. Cabinet (10) according to clause c19, wherein the gas-to-fluid heat exchanger (31) is coupled to a fluidic circuit (34) for conveying the second cooling medium (33) out of the cabinet.

c21. Cabinet (10) according to clause c19 or c20, wherein the gas-to-fluid heat exchanger (31) is a tube-type heat exchanger, positioned within the cabinet near the second side (17) thereby defining a second plenum space (39) between the heat exchanger and a rear wall (18) of the cabinet, and wherein the flow generator (30) comprises at least one fan that is provided within the second plenum space.

c22. Cabinet (10) according to any one of clauses c1-c21, comprising at least one of rails and linear bearings (8) arranged in a longitudinal direction (X) along the floor (22) of the cabinet.

c23. Cabinet (10) according to any one of clauses c1-c22, comprising at least one of a temperature sensor (52) configured for measuring a temperature (T) within the casing (12) and for generating a temperature measurement signal representative of the temperature, and a flow sensor (54) configured for locally measuring the fluid flow (11f) within the casing (12) and for generating a flow measurement signal representative of the fluid flow.

c24. Lithography unit (2) comprising:
a vacuum chamber (4);
a cabinet (10) for accommodating electronic equipment (46), according to any one of the clauses c1-c23.

c25. Lithography unit (2) according to clause c24, wherein the vacuum chamber (4) is provided with linear bearing members (8) at a top side (5) and along a longitudinal direction (X), and wherein the cabinet (10) is positioned on the top side of the vacuum chamber.

c26. Lithography unit (2) according to clause c25, wherein the vacuum chamber (4) is provided at a recessed section (7) of the top side (5) with an interface wall (6) provided with access ports for receiving and passing through conduits and/or cables (66) connected to electronic equipment (46) inside the cabinet (10).

c27. Lithography unit (2) according to clause c26, wherein the interface wall (6) extends over an entire width of the top side (5) of the vacuum chamber (4), and preferably is oriented in the vertical direction (Z).

c28. Lithography unit (2) according to clause c26 or c27, wherein the recessed section (7) is recessed at a rear side of the vacuum chamber (4), wherein the rear recessed side is provided a further interface wall provided with further access ports for receiving and passing through conduits and/or cables (66).

c29. Lithography system (1), comprising at least two lithography units (2) according to any one of clauses c24-c28, wherein the lithography units are arranged back-to-back, with the second sides (17) of respective cabinets (10) of back-to-back arranged lithography units (2) facing each other.

REFERENCE SIGNS LIST 1 lithography system
2a-e lithography unit
4a-e vacuum chamber
5 top side
6 interface wall
7 recessed section
8 linear bearing member (rails)
9 lateral duct
10a-e cabinet
12 casing (enclosure)
14 chamber
16a-b side wall
17 second side (rear side)
18a-e rear wall
20 top wall
22 floor
23 access side (front side)
24 opening
26a-b cabinet door
27 first cooling medium (e.g. gas/air)
28 flow guiding beam (power bar)
29a-b cooler frame
30 flow generator (air circulator e.g. fan)
31 heat exchanger
32 gas aperture
33 second cooling medium (e.g. fluid)
34 fluid conduit 35 first plenum space (fontal plenum space)
36 channel (corridor, central gap)
37 cabinet channel aperture
38 vertical recess (cable gutter)
39 second plenum space (rear plenum space)
40a-b rack
41 cooler frame channel aperture
42a-b rack wall
43a-b opposite rack wall
44 shelf
45 floor aperture
46 electronic equipment
47 electronic component
48 front inlet
49 blind panel
50 rear outlet
51 air supply opening
52 temperature sensor
53a-b fan mounting panels
54 flow sensor
56 control unit
58 first curved cable conduit
59 second curved cable conduit
60 third curved cable conduit
62 conduit aperture
63 floor conduit aperture
64 curved guide wall (metal strip)
66a-c cabling
70a-e load lock system
72 substrate supply system
74a-e chamber door
76a-e substrate transfer system
77a-d fan mount
78 fluid supply conduit
79 fluid discharge conduit
80 cooling manifold
81 channel wall portion
82 wall header
84 header wall portion
86 receding wall portion
88 recessed wall portion
90 shelf mount (mounting strip)
92 shelf connector (bolt)
93 further shelf connector (threaded hole or nut)
94 equipment panel
96 panel connector (bolt)
97 further panel connector (threaded hole or nut)
98 equipment side wall
100 aperture sealing member
110 power supply socket
112 power socket
114 safety fuse
116 power monitoring indicators
120 prior art rack
122 strut
124 L-shaped mounting bracket
126 mounting bracket connector
128 supporting bracket
130 vertical flange
132 supporting bracket connector
$\Phi f$ gas flow
$\Phi l$ liquid flow
T cabinet internal temperature
X longitudinal direction
Y transversal direction
Z vertical direction
Q thermal energy (heat)

Hr rack height
Hc channel height
Hp plenum height
Hi cabinet internal height
W1 equipment width
W1* intra header width
W2 space width
W3 flange width
W3* header width
W4 panel width
W5 additional width

The invention claimed is:

1. A cabinet for accommodating electronic equipment, wherein the cabinet comprises:
a casing comprising an access side provided with an opening for accessing the electronic equipment in the casing, and a second side opposite to the access side;
a pair of racks for accommodating the electronic equipment inside the casing, and positioned within the casing to define a first plenum space between the access side and the pair of racks; wherein the cabinet is configured for enclosing a first cooling medium in thermal communication with the electronic equipment;
a flow generator for generating a flow ($\Phi f$) of the first cooling medium from the first plenum space across the electronic equipment towards the second side;
a heat exchanger for extracting thermal energy (Q) from the first cooling medium,
wherein the heat exchanger and the flow generator are provided at or near the second side of the casing,
wherein the casing comprises a channel in fluid communication with the second side and the first plenum space, for re-circulating the first cooling medium from the second side to the first plenum space,
wherein the pair of racks comprise a first rack and a second rack that is laterally separated from the first rack, wherein the first rack comprises a lateral wall and the second rack comprises a further lateral wall facing the lateral wall of the first rack, wherein the channel is provided along the lateral wall of the first rack and the further lateral wall of the second rack, and wherein the channel is located between the first rack and the second rack along a longitudinal centerline of the cabinet,
wherein the lateral wall and the further lateral wall are formed by substantially closed panels that define vertical boundaries of the channel,
and wherein the channel is shared by the first rack and the second rack for recirculating the first cooling medium from which thermal energy has been extracted by the heat exchanger from the second side to the first plenum space via the channel.

2. The cabinet according to claim 1, wherein the lateral faek wall comprises an outer wall portion facing towards the channel and an inner wall portion facing away from the channel and comprising a recessed profile, wherein the recessed profile comprises a header wall portion, and a recessed wall portion that is parallel and flush with respect to the header wall portion, and arranged for accommodating a shelf mount for fixing a shelf to the inner wall portion.

3. The cabinet according to claim 1, wherein the heat exchanger and the flow generator are integrated into a cooler frame that is separately repositionable with respect to the casing.

4. The cabinet according to claim 3, wherein the repositionable cooler frame extends substantially over the entire second side of the casing, thereby covering an opening on the second side and forming a rear wall of the cabinet.

5. The cabinet according to claim 1, wherein the cabinet has an internal height (Hi) defined between inner surfaces of a top wall and a floor of the casing, and wherein the channel defines a vertical gap with a channel height (Hc) that equals the internal height (Hi).

6. The cabinet according to claim 1, comprising a flow guiding beam arranged in the first plenum space along a frontal aperture of the channel, for regularizing the recirculating flow (Φf) of the first cooling medium into the first plenum space.

7. The cabinet according to claim 6, wherein the flow guiding beam extends between the top wall and the floor of the casing, wherein the flow guiding beam is formed as a hollow member for accommodating and guiding at least one cable between the top wall and the floor.

8. The cabinet according to claim 1, wherein the first cooling medium is a gas, wherein the heat exchanger is a gas-to-fluid heat exchanger configured for transferring the thermal energy (Q) to a second cooling medium comprising a fluid.

9. The cabinet according to claim 8, wherein the gas-to-fluid heat exchanger is a tube-type heat exchanger, positioned within the cabinet near the second side thereby defining a second plenum space between the heat exchanger and a rear wall of the cabinet, and wherein the flow generator comprises at least one fan that is provided within the second plenum space.

10. The cabinet according to claim 1, wherein the first plenum space comprises a vertical recess at a side wall of the casing, for accommodating cabling for the electronic equipment along a vertical direction (Z).

11. The cabinet according to claim 10, wherein a side wall of the vertical recess is provided with at least one cable mount.

12. The cabinet according to claim 11, wherein the at least one cable mount is provided in or near a level range for the electronic equipment, for allowing cabling to be branched off the vertical recess in a lateral direction with the range of height at which the electronic equipment is included in the cabinet.

13. The cabinet according to claim 10, comprising a floor aperture, for guiding cabling accommodated in the vertical recess to a lower outside of the cabinet.

14. The cabinet according to claim 13, wherein the floor aperture is provided at a lateral end of the first plenum space.

15. The cabinet according to claim 10, comprising at least one cable conduit that branches off from the vertical recess, wherein the at least one cable conduit is formed by a conduit that is mounted on the side wall on an outside of the casing.

16. The cabinet according to claim 15, wherein the at least one cable conduit is formed by bent upper and lower walls included in between an inner wall pane and an outer wall pane of the side wall.

17. The cabinet according to claim 16, wherein the at least one cable conduit are curvedly shaped, preferably with a smooth curvature.

18. The cabinet according to claim 16, wherein the bent upper and lower walls of the at least one cable conduit terminate in a vertical direction (Z).

19. The cabinet according to claim 18, wherein the at least one cable conduit is directed downwards in the vertical direction (Z).

20. The cabinet according to claim 1, comprising at least one of a temperature sensor configured for measuring a temperature (T) within the casing and for generating a temperature measurement signal representative of the temperature, and a flow sensor configured for locally measuring the fluid flow (Φf) within the casing and for generating a flow measurement signal representative of the fluid flow.

21. A lithography unit comprising:
a vacuum chamber;
a cabinet for accommodating electronic equipment, according to claim 1,
wherein the vacuum chamber is provided with access ports for receiving and passing through conduits and/or cables connected to electronic equipment inside the cabinet.

22. The lithography unit according to claim 21, wherein the vacuum chamber is provided with linear bearing members at a top side and along a longitudinal direction (X), and wherein the cabinet is positioned on the top side of the vacuum chamber.

23. The lithography unit according to claim 22, wherein the vacuum chamber is provided at a recessed section of the top side with an interface wall provided with the access ports for receiving and passing through conduits and/or cables connected to the electronic equipment inside the cabinet.

24. The lithography unit according to claim 23, wherein the interface wall extends over an entire width of the top side of the vacuum chamber, and preferably is oriented in the vertical direction (Z).

25. The lithography unit according to claim 23, wherein the recessed section is recessed at a rear side of the vacuum chamber, wherein the rear recessed side is provided a further interface wall provided with further access ports for receiving and passing through conduits and/or cables.

26. A lithography system, comprising at least two lithography units according to claim 21, wherein the lithography units are arranged back-to-back, such that a second side of a first cabinet of a first of the at least two lithography units faces a second side of a second cabinet of a second of the at least two lithography units.

27. The lithography unit according to claim 21, further comprising a duct that is bounded by a lateral side of the vacuum chamber, wherein the duct is arranged for guiding further cables from the electronic equipment to a lower part of the vacuum chamber.

28. A cooler frame for a cabinet according to claim 1, the cooler frame comprising a heat exchanger for extracting thermal energy from a cooling medium and a flow generator for generating a flow of the cooling medium across the electronic equipment, wherein the cooling frame is positioned at a rear side of a casing of the cabinet opposite of an access side of the casing for accessing the electronic equipment in the casing, and wherein the cooler frame is separately repositionable with respect to the casing.

29. The cooler frame according to claim 28, wherein the cooler frame extends substantially over the entire rear side of the casing to cover the rear side and form a rear wall of the cabinet.

30. The cooler frame according to claim 28, wherein the cooler frame is repositionably mounted with respect to the casing by means of rails.

31. An arrangement of cooler frames comprising:
a first cooler frame for a first cabinet according to claim 1 for accommodating electronic equipment, the first cooler frame comprising a first heat exchanger for extracting thermal energy from a first cooling medium and a first flow generator for generating a flow of the first cooling medium across the electronic equipment, wherein the first cooling frame is positioned at a rear side of a first casing of the first cabinet opposite of an access side of the first casing for accessing the electronic equipment in the first casing;

a second cooler frame for a second cabinet according to claim 1 for accommodating further electronic equipment, the second cooler frame comprising a second heat exchanger for extracting thermal energy from a second cooling medium and a second flow generator for generating a flow of the second cooling medium across the further electronic equipment, wherein the second cooling frame is positioned at a rear side of a second casing of the second cabinet opposite of an access side of the second casing for accessing the further electronic equipment in the second casing; and a cooling fluid manifold positioned between the rear sides of the first and second cooler frames, wherein fluid conduits of the first and second heat exchangers are in fluid connection with the cooling fluid manifold, wherein a fluidic circuit of the cooling fluid manifold is arranged to circulate the first and second cooling medium through the fluid conduits of the first and second heat exchangers.

32. The cabinet according to claim 1, comprising a first part for accommodating electronic equipment and a second part comprising a cooler frame, wherein the first part comprises:
   the casing comprising the access side provided with the opening for accessing the electronic equipment in the casing, and the second side opposite to the access side; and
   the pair of racks for accommodating the electronic equipment inside the casing, and positioned within the casing to define the first plenum space,
   wherein the second part comprises:
   the flow generator for generating the flow ($\Phi f$) of the first cooling medium from across the electronic equipment; and
   the heat exchanger for extracting thermal energy (Q) from the first cooling medium, wherein the heat exchanger and the flow generator are integrated into the cooler frame that is located at or near the second side of the casing, and wherein the cooler frame is separately repositionable with respect to the casing.

33. The cabinet according to claim 32, wherein the heat exchanger comprises one or more tubes for guiding a second cooling medium, and wherein the heat exchanger is arranged to extract the thermal energy from the first cooling medium using the second cooling medium flowing through the one or more tubes.

34. The cabinet according to claim 33, wherein the first cooling medium is a gas and wherein the second cooling medium is a fluid.

35. The cabinet according to claim 34, wherein the first cooling medium is air.

36. The cabinet according to claim 34, wherein the second cooling medium is one of water and a refrigerant.

37. The cabinet according to claim 32, wherein the repositionable cooler frame extends substantially over the entire second side of the casing, thereby covering an opening on the second side and forming a rear wall of the cabinet.

38. An arrangement of cabinets comprising a first cabinet according to claim 1 and a second cabinet according to claim 1,
   wherein the first cabinet is arranged for accommodating electronic equipment, and
   wherein the first cabinet comprises a first cooler frame, the first cooler frame comprising a first heat exchanger for extracting thermal energy from a cooling medium and a first flow generator for generating a flow of the cooling medium across the electronic equipment, wherein the first cooling frame is positioned at a rear side of a first casing of the first cabinet opposite of an access side of the first casing for accessing the electronic equipment in the first casing,
   wherein the second cabinet is arranged for accommodating further electronic equipment, and wherein the second cabinet comprises a second cooler frame, the second cooler frame comprising a second heat exchanger for extracting thermal energy from the cooling medium and a second flow generator for generating a flow of the cooling medium across the further electronic equipment, wherein the second cooling frame is positioned at a rear side of a second casing of the second cabinet opposite of an access side of the second casing for accessing the further electronic equipment in the second casing,
   wherein a cooling fluid manifold is positioned between the rear sides of the first and second cooler frames,
   wherein fluid conduits of the first and second heat exchangers are in fluid connection with the cooling fluid manifold, wherein a fluidic circuit of the cooling fluid manifold is arranged to circulate the cooling medium through the fluid conduits of the first and second heat exchangers.

39. The arrangement according to claim 38, wherein the first cabinet and the second cabinet form a set of cabinets, and wherein multiple sets of cabinets are arranged side by side, wherein the cooling fluid manifold extends along the multiple sets of cabinets.

40. A controlled environment room comprising at least one of: one or more cabinets according to claim 1;
   one or more lithography units according to claim 21;
   a lithography system according to claim 26;
   one or more cooler frames according to claim 28;
   an arrangement of cooler frames according to claim 31;
   one or more cabinets according to claim 32;
   an arrangement of cabinets according to claim 38.

* * * * *